United States Patent
Iorga et al.

(10) Patent No.: US 9,548,726 B1
(45) Date of Patent: Jan. 17, 2017

(54) SLEW-RATE CONTROL AND WAVESHAPE ADJUSTED DRIVERS FOR IMPROVING SIGNAL INTEGRITY ON MULTI-LOADS TRANSMISSION LINE INTERCONNECTS

(71) Applicant: INPHI CORPORATION, Santa Clara, CA (US)

(72) Inventors: Cosmin Iorga, Newbury Park, CA (US); Jeffrey C. Yen, Westlake Village, CA (US)

(73) Assignee: INPHI CORPORATION, Santa Clara, CA (US)

( * ) Notice: Subject to any disclaimer, the term of this patent is extended or adjusted under 35 U.S.C. 154(b) by 92 days.

(21) Appl. No.: 14/622,550

(22) Filed: Feb. 13, 2015

(51) Int. Cl.
  *H03K 3/012* (2006.01)
  *H03K 17/56* (2006.01)
  *H03K 17/16* (2006.01)

(52) U.S. Cl.
  CPC ............. *H03K 3/012* (2013.01); *H03K 17/56* (2013.01); *H03K 17/165* (2013.01)

(58) Field of Classification Search
  None
  See application file for complete search history.

(56) References Cited

U.S. PATENT DOCUMENTS

| | | | | |
|---|---|---|---|---|
| 4,906,867 A | * | 3/1990 | Petty | G11C 7/1051 326/15 |
| 5,587,678 A | * | 12/1996 | Dijkmans | H03K 19/00361 326/26 |
| 5,592,612 A | | 1/1997 | Birk | |
| 5,973,541 A | * | 10/1999 | Rajivan | G01R 31/30 326/31 |
| 6,128,094 A | | 10/2000 | Smith | |
| 6,163,178 A | * | 12/2000 | Stark | G11C 7/1051 327/108 |
| 6,236,248 B1 | * | 5/2001 | Koga | H03K 17/6872 326/27 |
| 6,400,621 B2 | | 6/2002 | Hidaka et al. | |
| 6,483,354 B1 | * | 11/2002 | Gasparik | H03K 17/163 326/27 |
| 6,542,956 B1 | | 4/2003 | Lee et al. | |
| 6,993,701 B2 | | 1/2006 | Corbett et al. | |
| 7,019,551 B1 | * | 3/2006 | Biesterfeldt | H03K 17/163 326/27 |

(Continued)

OTHER PUBLICATIONS

Office Action for U.S. Appl. No. 13/653,373, dated Mar. 27, 2014.

(Continued)

*Primary Examiner* — Thomas J Hiltunen
(74) *Attorney, Agent, or Firm* — Richard T. Ogawa; Ogawa P.C.

(57) ABSTRACT

A driver integrated circuit (IC) device. The driver device can include a front-end module, a pre-driver module, and a driver module coupled to a transmission line path. The pre-driver module can be coupled to the front-end module and can include one or more delay adjust capacitor modules, and one or more pull-down control modules. The driver module can be coupled to the pre-driver module, the driver module including one or more pull-down control logic modules. This driver device can configured in several implementations to provide control and programmability of a driver slew rate to maximize a signal integrity eye opening.

14 Claims, 32 Drawing Sheets

(56) References Cited

U.S. PATENT DOCUMENTS

| | | | |
|---|---|---|---|
| 7,656,727 B2 | 2/2010 | Thayer | |
| 7,688,120 B2 * | 3/2010 | Kim | G11C 7/1051 |
| | | | 327/108 |
| 7,990,746 B2 | 8/2011 | Rajan | |
| 8,325,554 B2 | 12/2012 | Sweere et al. | |
| 8,373,451 B1 * | 2/2013 | Ferguson | H03K 19/00 |
| | | | 327/108 |
| 8,687,451 B2 | 4/2014 | Wang | |
| 8,928,366 B2 * | 1/2015 | Huang | H03K 17/165 |
| | | | 327/108 |
| 2004/0123029 A1 | 6/2004 | Dalal et al. | |
| 2006/0200697 A1 | 9/2006 | Ito | |
| 2008/0104290 A1 | 5/2008 | Cowell et al. | |
| 2008/0183959 A1 | 7/2008 | Pelley et al. | |
| 2009/0141558 A1 | 6/2009 | Sarin et al. | |
| 2009/0300259 A1 | 12/2009 | Luo et al. | |
| 2010/0005212 A1 | 1/2010 | Gower et al. | |
| 2010/0162037 A1 | 6/2010 | Maule et al. | |
| 2010/0199125 A1 | 8/2010 | Reche | |
| 2010/0274952 A1 | 10/2010 | Lee | |
| 2011/0072200 A1 | 3/2011 | Lee et al. | |
| 2011/0125990 A1 | 5/2011 | Khosravi et al. | |
| 2011/0170329 A1 | 7/2011 | Kang | |
| 2012/0151294 A1 | 6/2012 | Yoo et al. | |
| 2012/0243299 A1 | 9/2012 | Shau | |
| 2012/0257459 A1 | 10/2012 | Berke | |
| 2012/0297231 A1 | 11/2012 | Qawami et al. | |
| 2013/0060996 A1 | 3/2013 | Berke | |

OTHER PUBLICATIONS

Notice of Allowance for U.S. Appl. No. 13/558,332, dated Feb. 25, 2014.
Office Action for U.S. Appl. No. 13/620,288, dated Oct. 1, 2013.
Office Action for U.S. Appl. No. 13/791,814, dated May 1, 2014.
Office Action for U.S. Appl. No. 13/619,692, dated May 14, 2014.
Office Action for U.S. Appl. No. 13/620,288, dated May 15, 2014.
Office Action for U.S. Appl. No. 13/791,807, dated May 29, 2014.
Office Action for U.S. Appl. No. 14/178,241, dated Jun. 27, 2014.

* cited by examiner

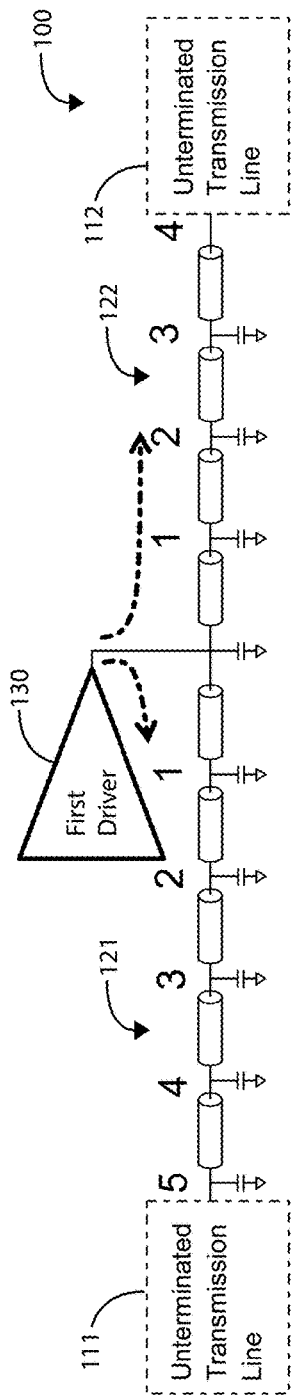
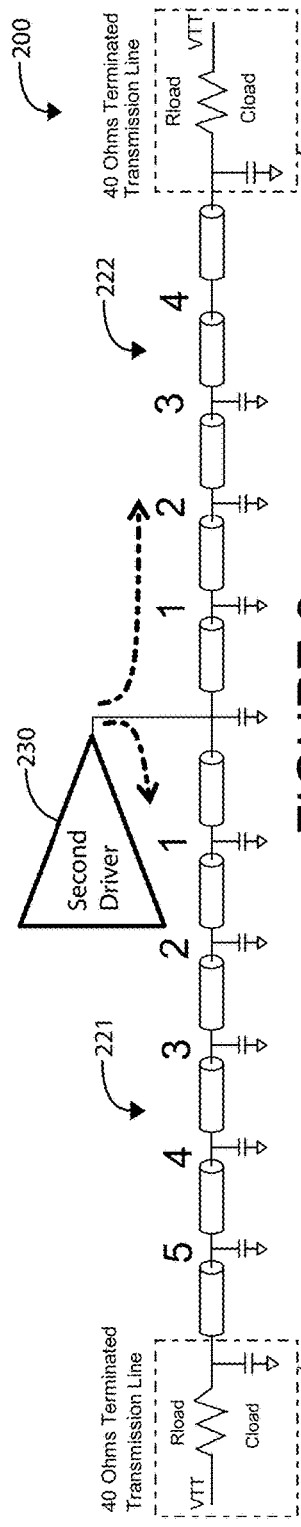
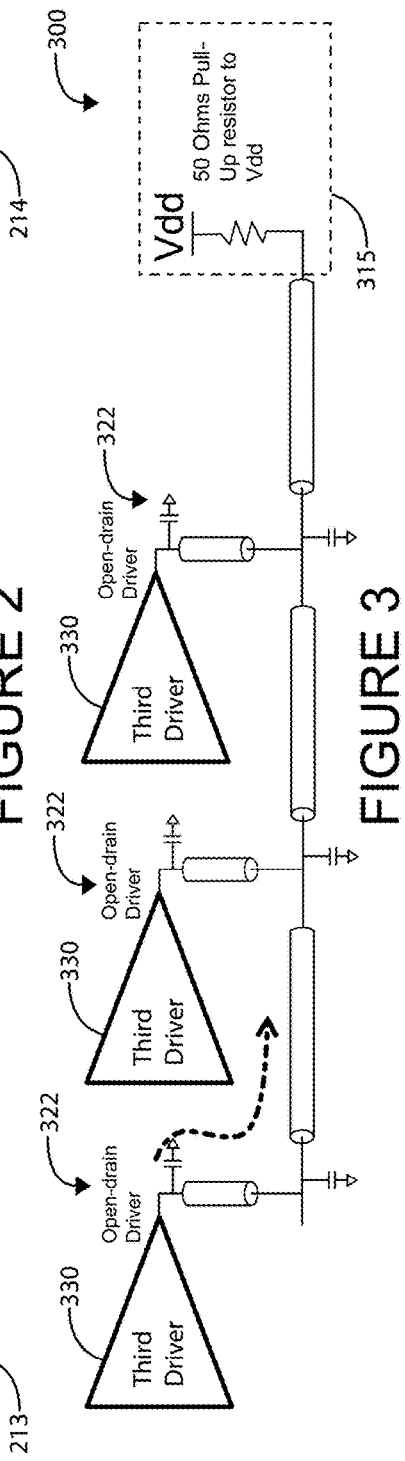
FIGURE 1
FIGURE 2
FIGURE 3

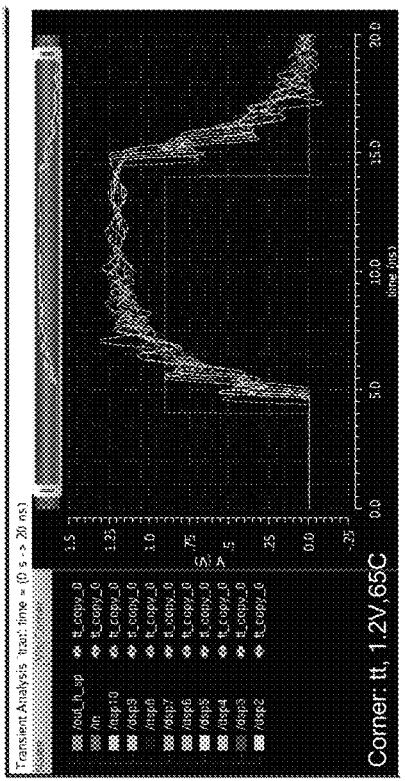
FIGURE 12C
FIGURE 12D
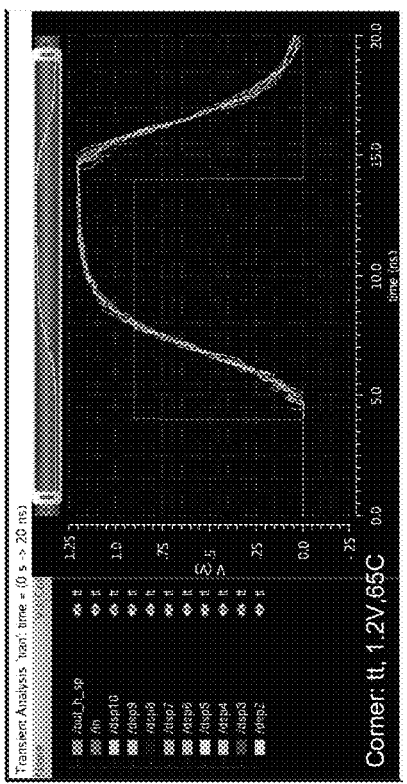
FIGURE 12A
FIGURE 12B

Slow Mode (slew rate=0.5V/ns)

JEDEC Min slew rate mode (slew rate=2V/ns)

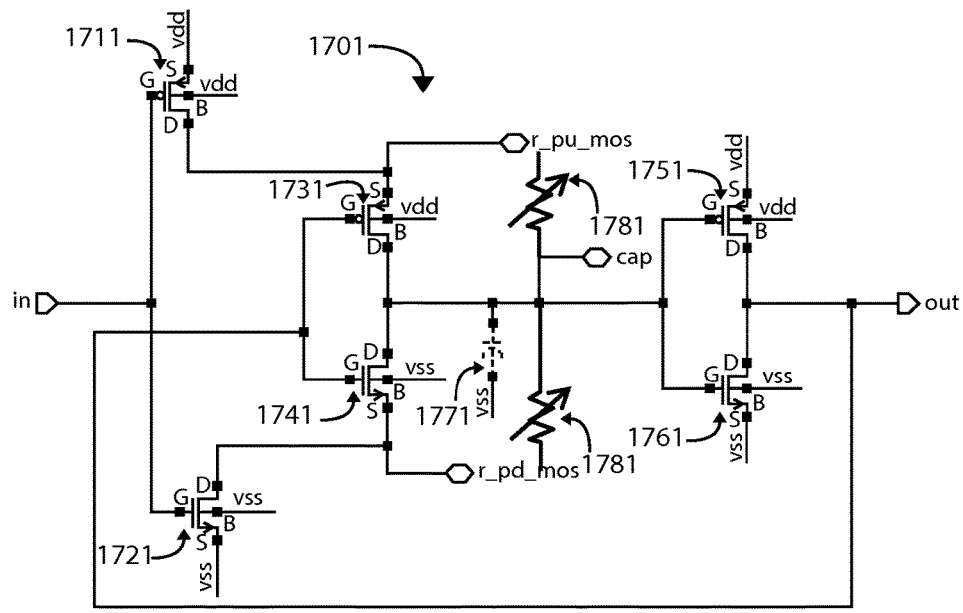
FIGURE 17A
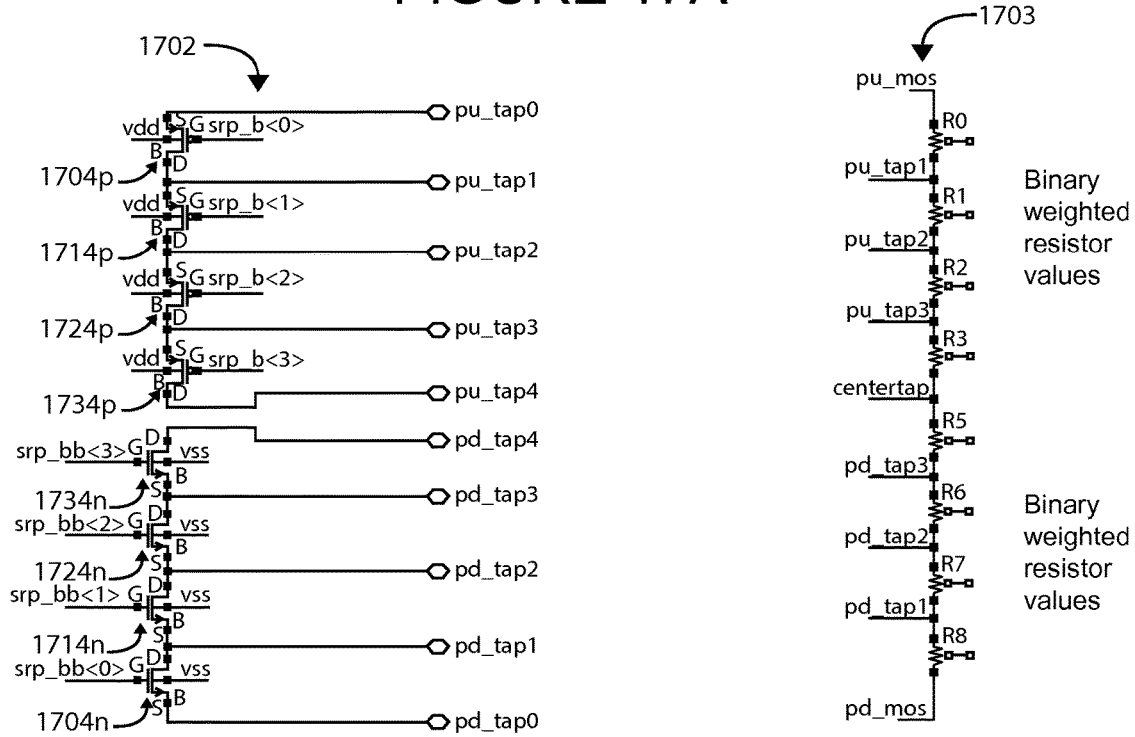
FIGURE 17B
FIGURE 17C

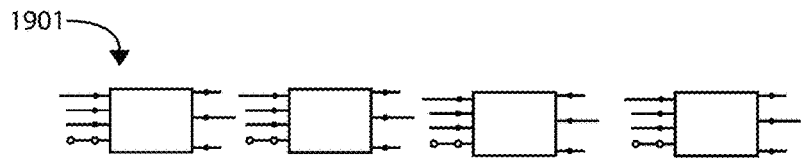
FIGURE 19A
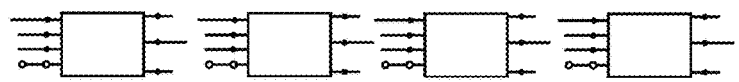
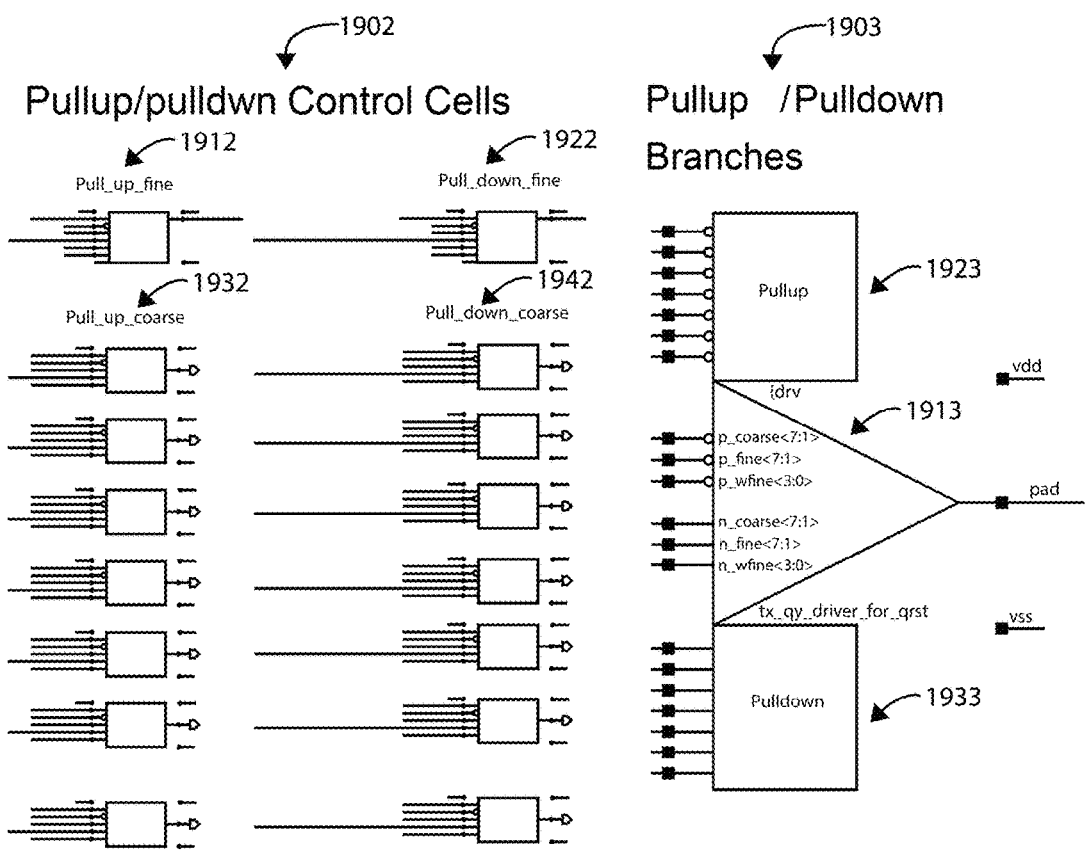
FIGURE 19B            FIGURE 19C

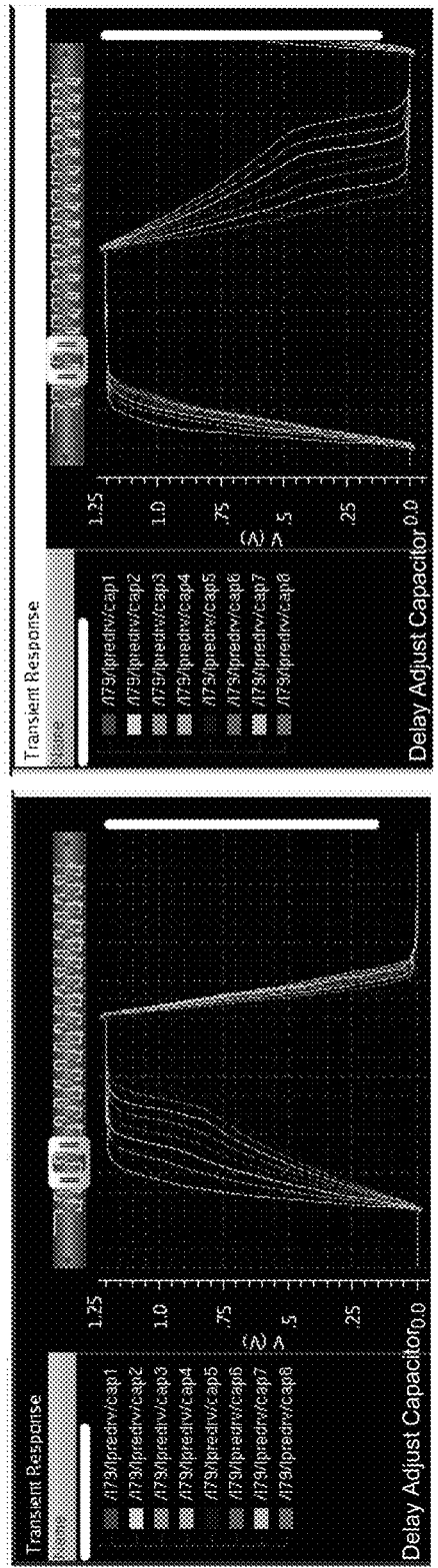
FIGURE 22A
FIGURE 22C
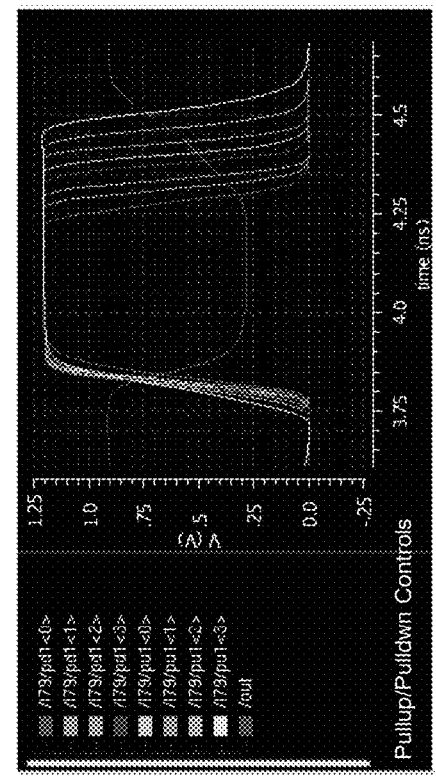
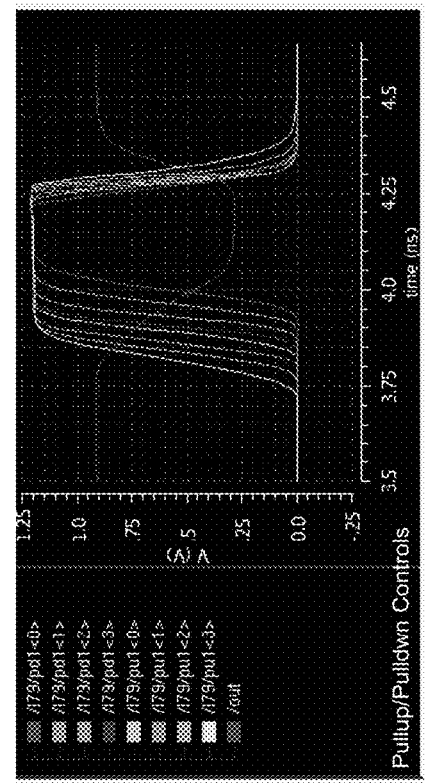
FIGURE 22B
FIGURE 22D

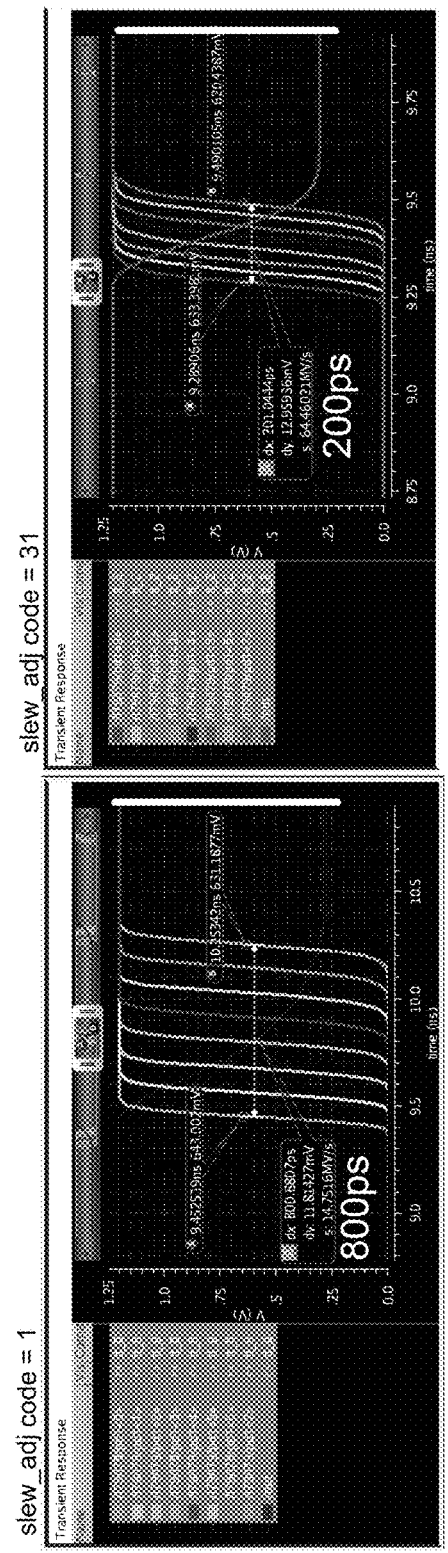
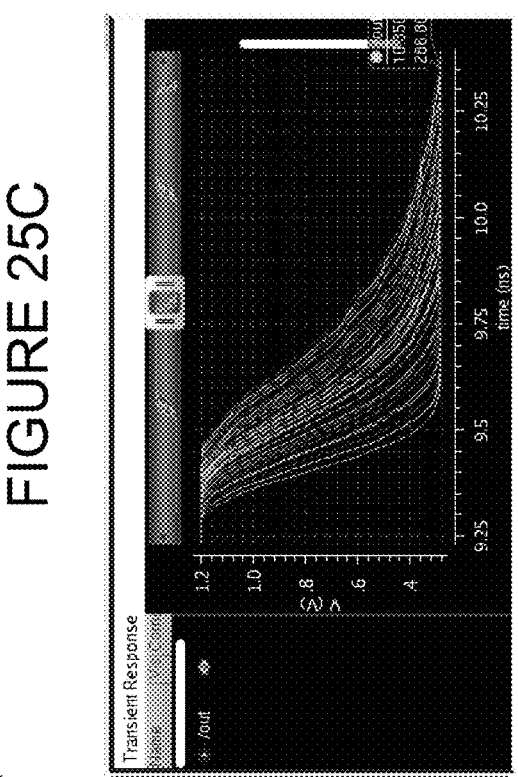
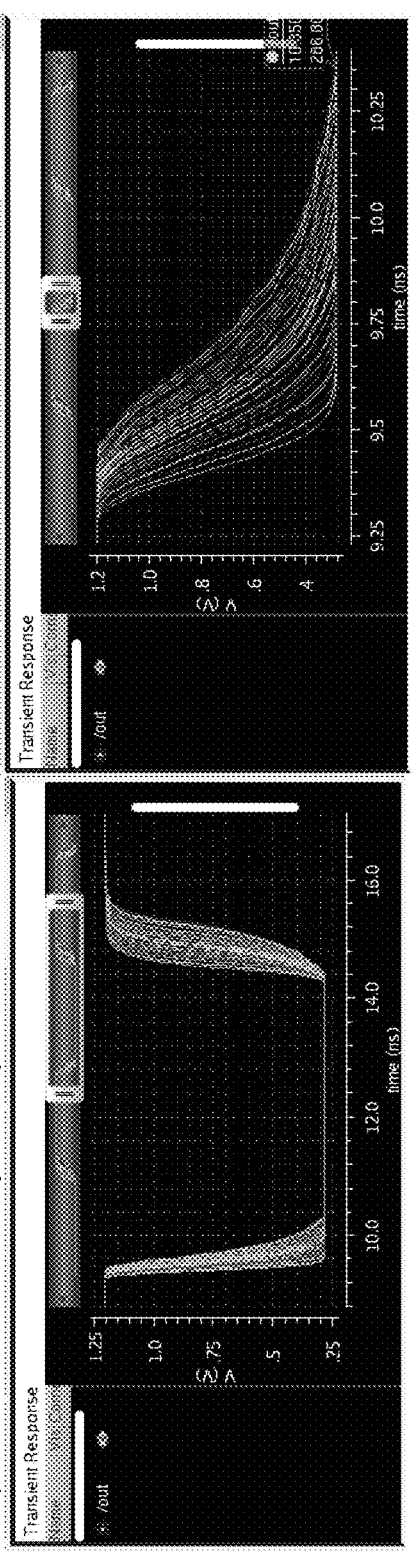
FIGURE 25A
FIGURE 25B
FIGURE 25C
FIGURE 25D

SLEW-RATE CONTROL AND WAVESHAPE ADJUSTED DRIVERS FOR IMPROVING SIGNAL INTEGRITY ON MULTI-LOADS TRANSMISSION LINE INTERCONNECTS

CROSS-REFERENCES TO RELATED APPLICATIONS

N/A

BACKGROUND OF THE INVENTION

The present invention relates to communication systems, memory systems, and integrated circuit (IC) devices.

Over the last few decades, the use of communication networks has exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

CMOS technology is commonly used to design communication and memory systems. As CMOS technology is scaled down to make circuits and systems run at higher speed and occupy smaller chip (die) area, the operating supply voltage is reduced for lower power. An important factor in device operations is slew rate, which is a ratio of a rise or fall in voltage to the amount of time that rise or fall takes. Consequently, slew rate is a quantity which can be a controlling factor in the performance characteristics of a device. A device having a low slew rate can degrade the performance and speed of a system containing the device, while a device having a high slew rate may not allow the system to react to changes in the state of the device, and thereby cause breakdown of the system. These limitations provide significant challenges to the continued improvement of communication systems scaling and performance.

Process variations between different fabrication processes can cause large variations it device characteristics, such as drain to source current. Such variations in device characteristics make it difficult, if not impossible, to insure that a device will exhibit slew rate characteristics within the performance window as set forth by a manufacturer. Accordingly, improvements to slew rate control in integrated circuit devices are highly desirable.

BRIEF SUMMARY OF THE INVENTION

The present invention relates to communication systems, memory systems, and integrated circuit (IC) devices. More particularly, the present invention provides slew rate control and waveshape adjusted drivers for improving signal integrity on multi-loads transmission line interconnects.

Memory module devices, such as dual-inline memory modules (DIMMs), can have multiple database circuits connected on the same transmission line path. Having multiple database circuits connected on the same transmission line path within an IC device causes impedance discontinuities. These characteristic impedance discontinuities generate multiple reflections that degrade the signal integrity of the IC device, which degrades performance and even render circuits non-functional. Reducing the slew rate, the maximum rate of change of output voltage per unit of time, of signal edges can reduce the effects of multiple reflections. However, inadequate slew rates prevents communication signals from reaching the desired logic high and low levels, leading to reduced signal amplitude and eye-opening (height, peak to peak).

In an embodiment, the present invention provides a driver integrated circuit. The driver device can include a front-end module, a pre-driver module, and a driver module coupled to a transmission line path. The pre-driver module can be coupled to the front-end module and can include one or more delay adjust capacitor modules, and one or more pull-down control modules. The driver module can be coupled to the pre-driver module, the driver module including one or more pull-down control logic modules. This driver device can configured in several implementations to provide control and programmability of a driver slew rate.

Many benefits are recognized through various embodiments of the present invention. Such benefits include several methods and circuit devices that allow the control and programmability of a driver slew rate. With control over the slew rate, the slew rate can be optimized to a value that maximizes the signal integrity eye opening. The slew rate control can be implemented in several driver embodiments, each addressing a specific structure of transmission line path and characteristic impedance termination. These embodiments include, but are not limited to, the following: QRST driver, BCOM driver, and ALERTn driver. Furthermore, these embodiments can be implemented within a registering clock driver (RCD) IC device, register control interface device, or register buffer device. Other benefits will be recognized by those of ordinary skill in the art that the mechanisms described can be applied to other IC systems as well.

BRIEF DESCRIPTION OF THE DRAWINGS

FIGS. 1 to 3 are simplified block diagrams each illustrating a driver integrated circuit according to an embodiment of the present invention.

FIGS. 12A to 12D are simplified graphs representing test bench simulations according to the driver integrated circuit of FIG. 11.

FIGS. 17A to 17C are simplified circuit diagrams illustrating a driver integrated circuit according to an embodiment of the present invention.

FIGS. 19A to 19C are simplified circuit diagrams illustrating a driver integrated circuit according to an embodiment of the present invention.

FIGS. 22A to 22D are simplified graphs representing transient responses for a driver integrated circuit according embodiments of the present invention.

FIGS. 25A to 25D are simplified graphs representing transient responses for a driver integrated circuit according to embodiments of the present invention.

DETAILED DESCRIPTION OF THE INVENTION

Figure 4A:
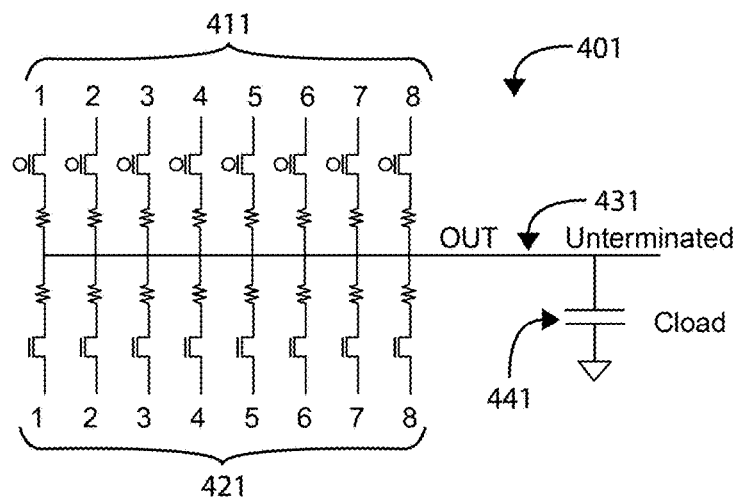
FIG. 4A is a simplified circuit diagram illustrating a driver integrated circuit according to an embodiment of the present invention.

The present invention relates to communication systems, memory systems, and integrated circuit (IC) devices. More particularly, the present invention provides slew rate control and waveshape adjusted drivers for improving signal integrity on multi-loads transmission line interconnects.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Memory module devices, such as dual-inline memory modules (DIMMs), can have multiple database circuits connected on the same transmission line path. Having multiple database circuits connected on the same transmission line path within an IC device causes impedance discontinuities. These characteristic impedance discontinuities generate multiple reflections that degrade the signal integrity of the IC device, which degrades performance and even render circuits non-functional. Reducing the slew rate, the maximum rate of change of output voltage per unit of time, of signal edges can reduce the effects of multiple reflections. However, inadequate slew rates prevents communication signals from reaching the desired logic high and low levels, leading to reduced signal amplitude and eye-opening (height, peak to peak).

In various embodiments, the present invention provides several methods and circuit devices that allows the control and programmability of a driver slew rate. The slew rate control can be implemented in several driver embodiments, each addressing a specific structure of transmission line path and characteristic impedance termination. These embodiments include, but are not limited to, the following: QRST driver, BCOM driver, and ALERTn driver. Furthermore, these embodiments can be implemented within a registering clock driver (RCD) or register buffer device.

FIG. 1 is a simplified block diagram illustrating a QRST driver integrated circuit 100 according to an embodiment of the present invention. As shown, a first driver 130, which can be configured as a QRST driver, is coupled to a multi-load transmission line having a first side 121 and a second side 122. Both sides include multiple loads represented by the grounded capacitor elements. Both ends of the transmission line are also unterminated as represented by blocks 111 and 112.

FIG. 2 is a simplified block diagram illustrating a BCOM driver integrated circuit 200 according to an embodiment of the present invention. As shown, a second driver 230, which can be configured as a BCOM driver, is coupled to a multi-load transmission line having a first side 221 and a second side 222. Both sides include multiple loads represented by the grounded capacitor elements, similar to FIG. 1. However, both ends 213 and 214 in this case are 40 Ohms terminated transmission lines.

FIG. 3 is a simplified block diagrams illustrating an ALERTn driver integrated circuit 300 according to an embodiment of the present invention. As shown, one or more third drivers 330, which can be configured as ALERTn drivers, are coupled to a multi-load transmission line. These drivers can be configured as open drain drivers, open collector drivers, or the like. The transmission line is coupled to a 50 Ohm resistor to a vdd voltage source. Each of the drivers from FIGS. 1 to 3 can be implemented in an RCD chip for an IC memory device, communications device, or the like.

FIG. 4A is a simplified circuit diagram illustrating a driver integrated circuit according to an embodiment of the present invention. This driver IC can represent a similar implementation to that shown in FIG. 1. As shown, the driver integrated circuit 401 includes pull-up transistors 411 and pull-down transistors 421 coupled to a transmission line 431, which is coupled to a capacitive load 441. In this embodiment, the transmission line 431 is unterminated.

Figure 4B:
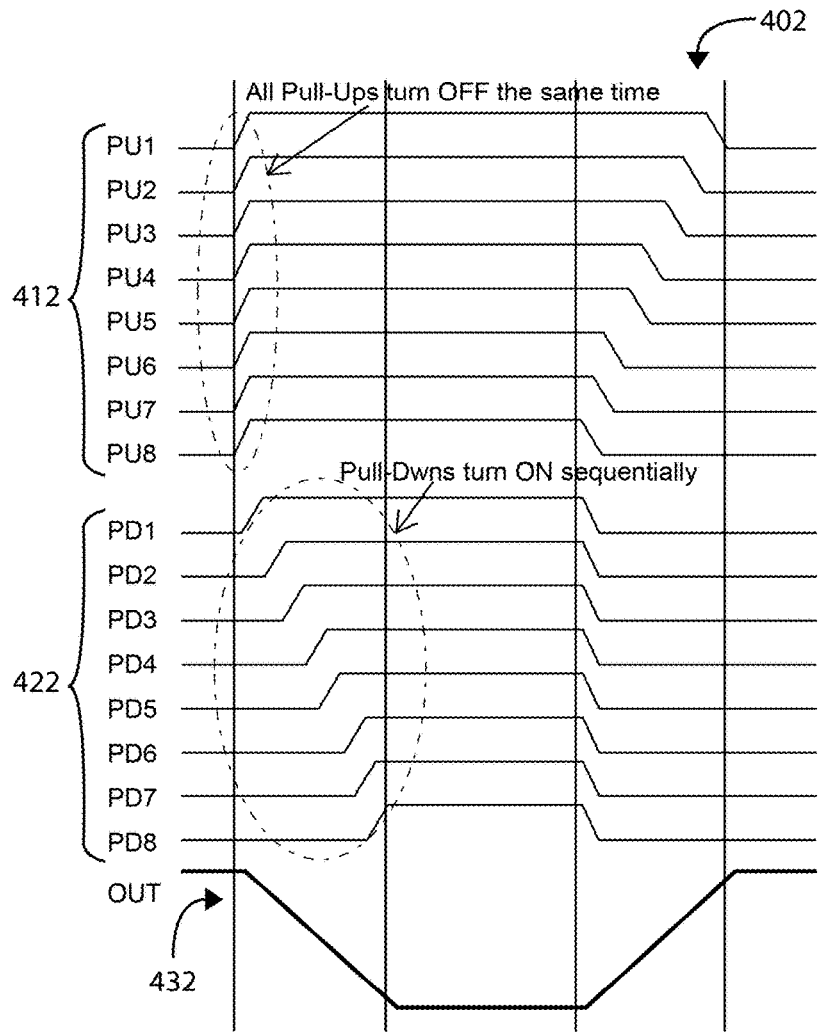
FIG. 4B is a simplified timing diagram illustrating waveform characteristics of a driver integrated circuit according to an embodiment of the present invention.

FIG. 4B is a simplified timing diagram illustrating waveform characteristics of a driver integrated circuit according to an embodiment of the present invention. This timing diagram 402 shows the operation of the driver IC described in FIG. 4A. All of the pull-up signals 412 turn off at the same time, but the pull-down signals 422 turn on sequentially, which means that the current into the load shuts down gradually. The characteristic output 432 is shown at the bottom.

Figure 5A:
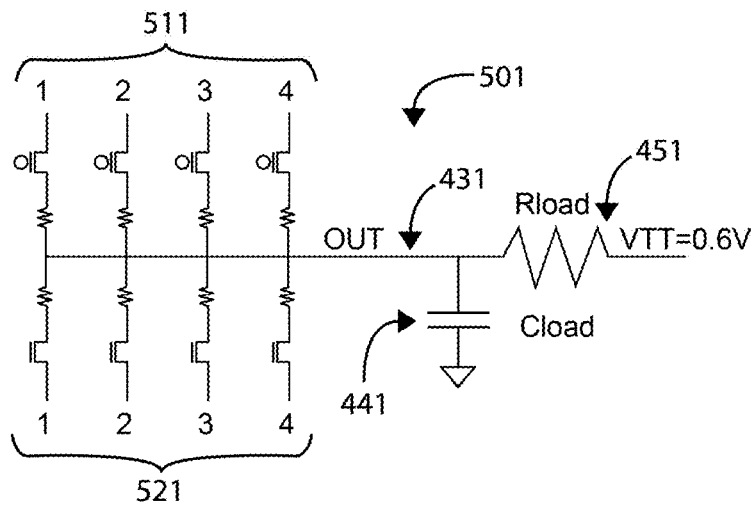
FIG. 5A is a simplified circuit diagram illustrating a driver integrated circuit according to an embodiment of the present invention.

FIG. 5A is a simplified circuit diagram illustrating a driver integrated circuit according to an embodiment of the present invention. This driver IC can represent a similar implementation to that shown in FIG. 2. As shown, the driver integrated circuit 501 includes pull-up transistors 511 and pull-down transistors 521 coupled to a transmission line 531, which is coupled to a capacitive load 541. In this embodiment, the transmission line 531 is terminated to a resistive load 451 with Vtt=0.6V.

Figure 5B:
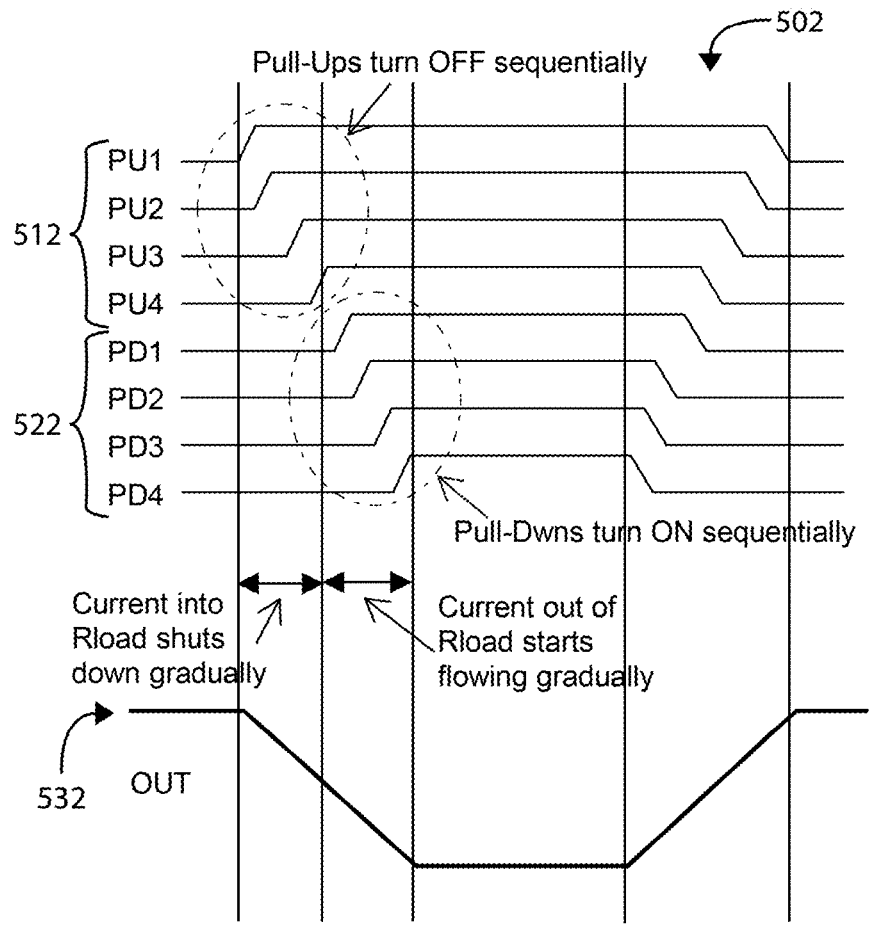
FIG. 5B is a simplified timing diagram illustrating waveform characteristics of a driver integrated circuit according to an embodiment of the present invention.

FIG. 5B is a simplified timing diagram illustrating waveform characteristics of a driver integrated circuit according to an embodiment of the present invention. This timing diagram 502 shows the operation of the driver IC described in FIG. 5A. All of the pull-up signals 512 turn off sequentially and the pull-down signals 522 turn on sequentially, which means that the current into the load shuts down gradually and the current out of the load starts flowing gradually. The characteristic output 532 is shown at the bottom.

Figure 6A:
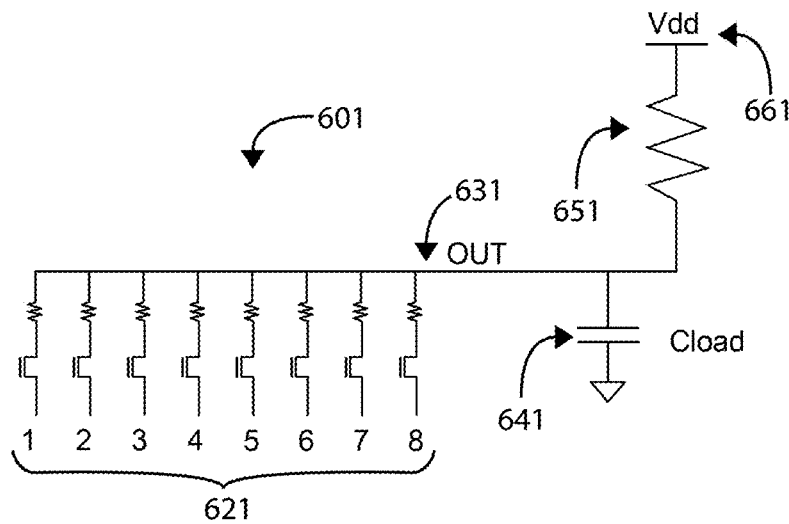
FIG. 6A is a simplified circuit diagram illustrating a driver integrated circuit according to an embodiment of the present invention.

FIG. 6A is a simplified circuit diagram illustrating a driver integrated circuit according to an embodiment of the present invention. This driver IC can represent a similar implementation to that shown in FIG. 3. As shown, the driver integrated circuit 601 includes pull-down transistors 621 coupled to a transmission line 631, which is coupled to a capacitive load 641. In this embodiment, the transmission line 631 is terminated through a resistive load 651 to a vdd voltage source 661.

Figure 6B:
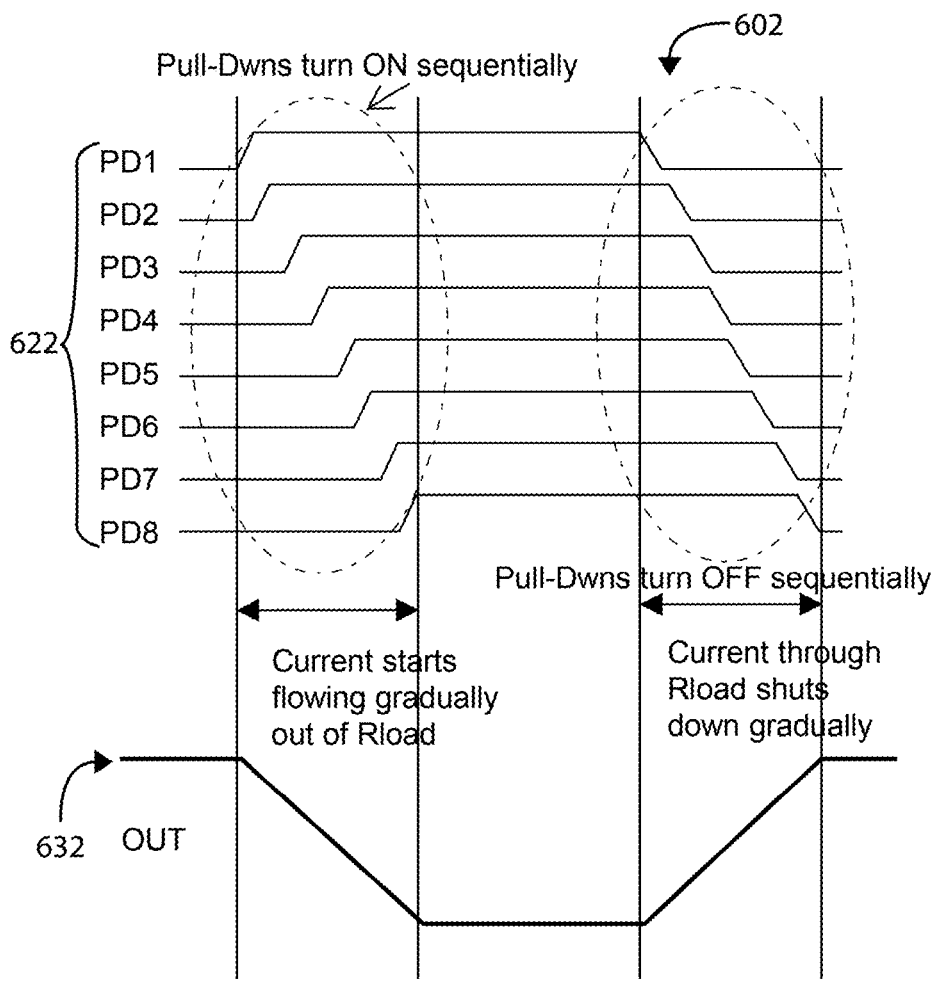
FIG. 6B is a simplified timing diagram illustrating waveform characteristics of a driver integrated circuit according to an embodiment of the present invention

FIG. 6B is a simplified timing diagram illustrating waveform characteristics of a driver integrated circuit according to an embodiment of the present invention. This timing diagram shows the operation of the driver IC described in FIG. 6A. All of the pull-down signals turn on sequentially and turn off sequentially, which means that the current starts flowing out of the load gradually and the current through the load shuts down gradually. The characteristic output is shown at the bottom.

Figure 7:
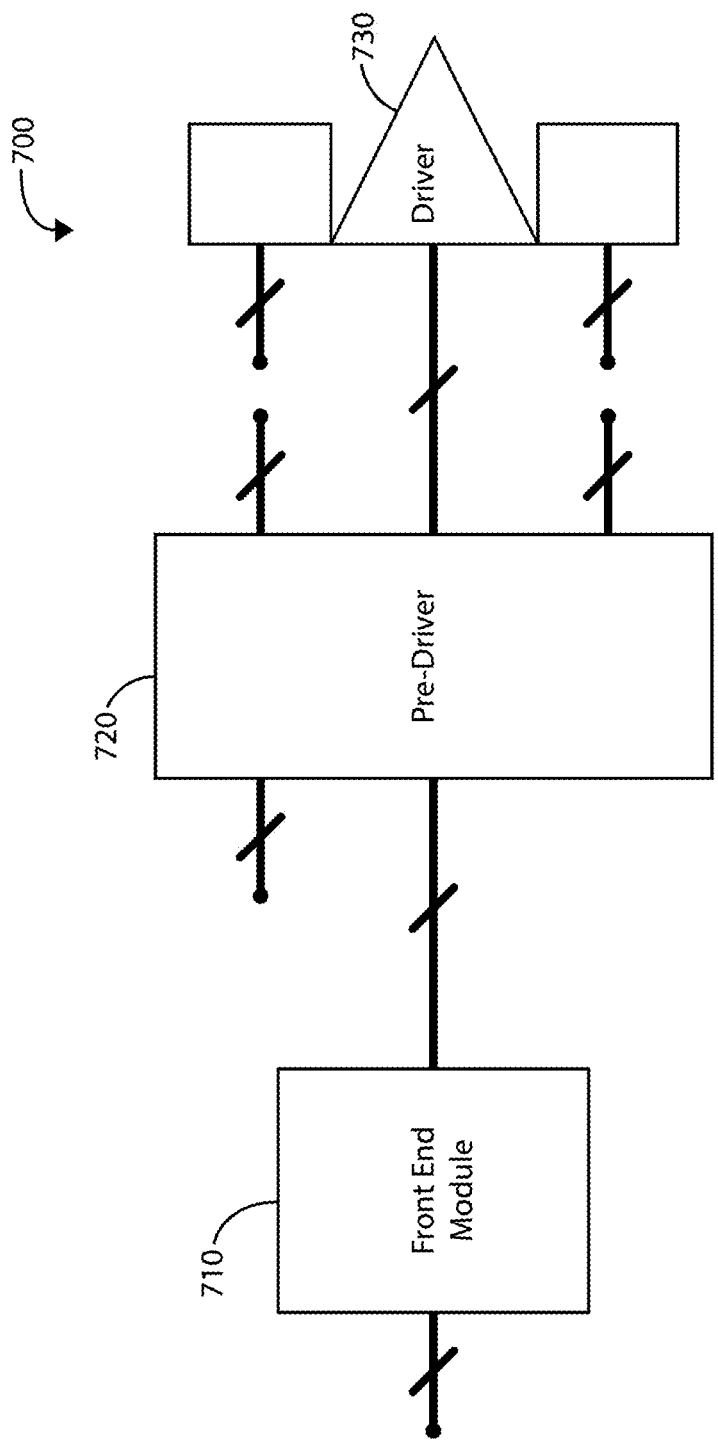
FIG. 7 is a simplified block diagram illustrating a driver integrated circuit according to an embodiment of the present invention.

FIG. 7 is a simplified block diagram illustrating a driver integrated circuit according to an embodiment of the present invention. As shown, driver IC 700 includes a front end module 710 coupled to a pre-driver 720, which is then coupled to a driver 730. Further details are provided in FIGS. 8 and 9A-9D.

Figure 8:
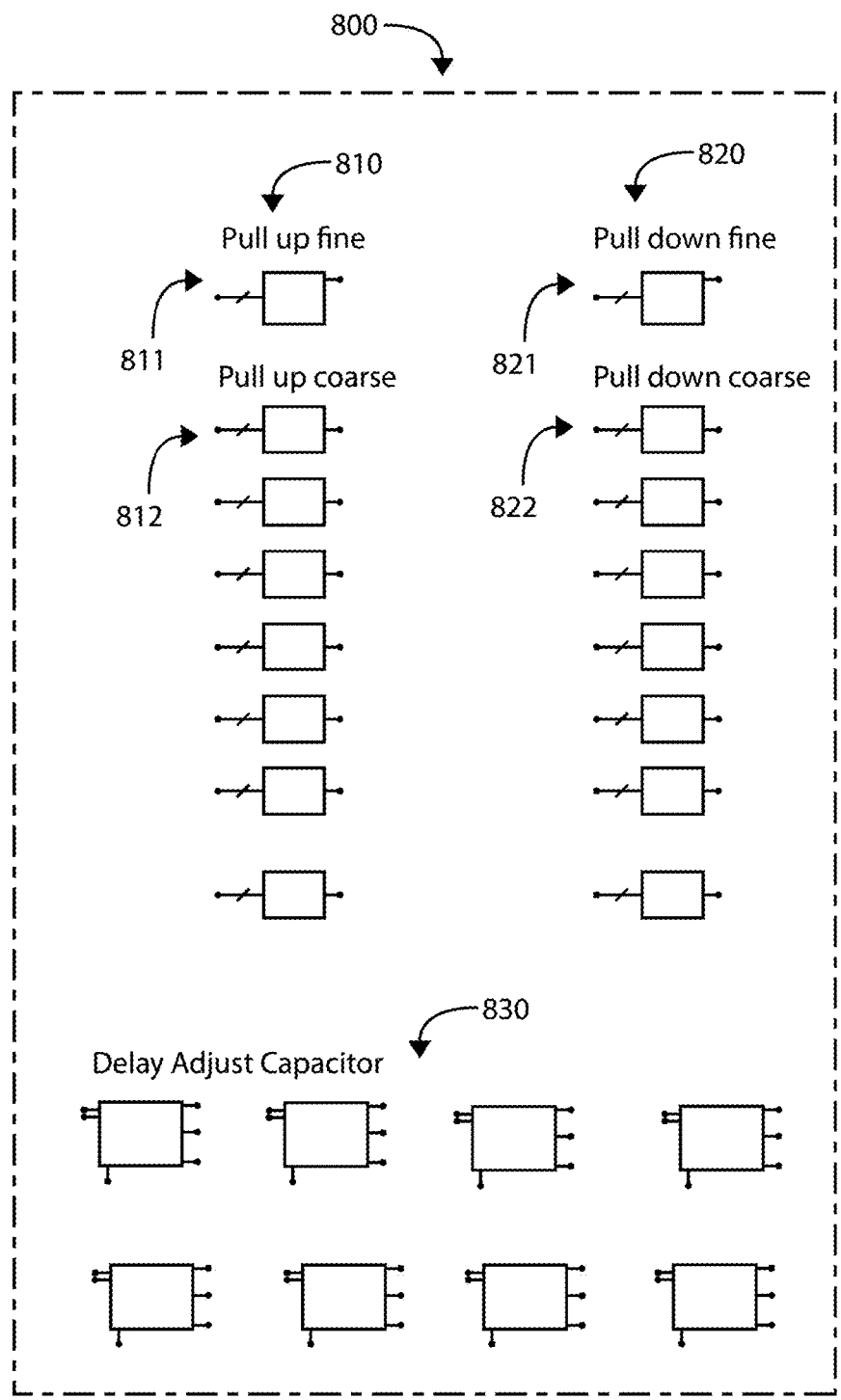
FIG. 8 is a simplified circuit diagram illustrating a pre-driver circuit according to an embodiment of the driver integrated circuit of FIG. 7.

FIG. 8 is a simplified circuit diagram illustrating a pre-driver circuit according to an embodiment of the driver integrated circuit of FIG. 7. As shown, the pre-driver circuit 800 includes a plurality of delay adjust capacitor modules 830 and pull-up control modules 810 and pull-down control modules 820. In a specific embodiment, the pull-up control modules 810 can include fine pull-up control modules 811 and coarse pull-up control modules 812. Similarly, the pull-down control modules 820 can include fine pull-down control modules 821 and coarse pull-down control modules 822.

Figure 9A:
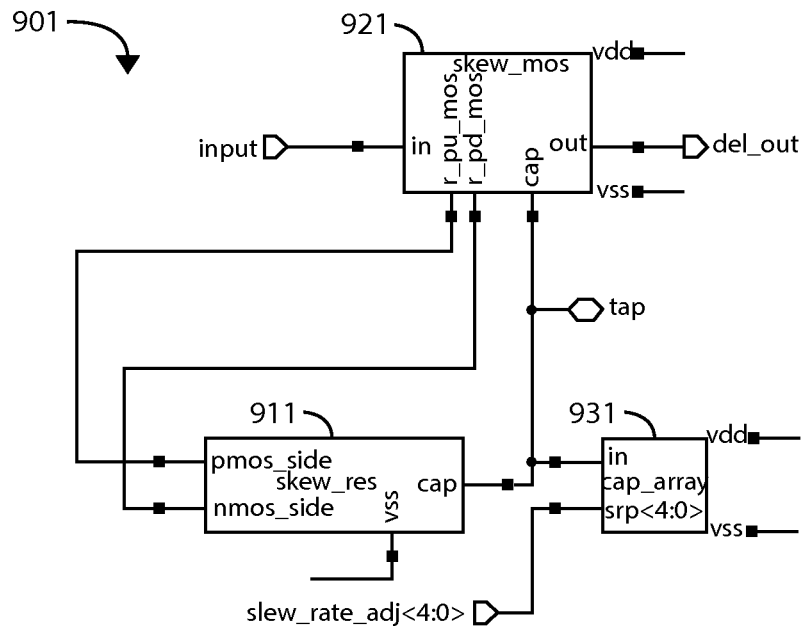
FIGS. 9A to 9D are simplified circuit diagrams illustrating a driver circuit according to an embodiment of the driver integrated circuit of FIG. 7.

FIGS. 9A to 9D are simplified circuit diagrams illustrating a driver circuit according to an embodiment of the driver integrated circuit of FIG. 7. More specifically, FIG. 9A is a simplified block diagram of a delay cell configured within the QRST driver. This delay cell 901 includes a skew resistor module 911, a skew mos module 921, and a cap array module 931. The skew resistor module includes a pmos node (pmos_side), an nmos node (nmos_side), a cap node (cap), and a vss node (vss). The skew mos module includes an input node (in), a pull-up node (r_pu_mos), a pull-down node (r_pd_mos), a vss node (vss), a vdd node (vdd), a cap node (cap), and an output node (out). The pull-up node is coupled to the pmos node of the skew resistor module and the pull-down node is coupled to the nmos node of the same. The cap nodes of both modules are also coupled to each other. The cap array module includes an input node, a vss node, a vdd node, and an array node. The input node of the cap array module is coupled to the cap nodes of the other two modules.

Figure 9B:
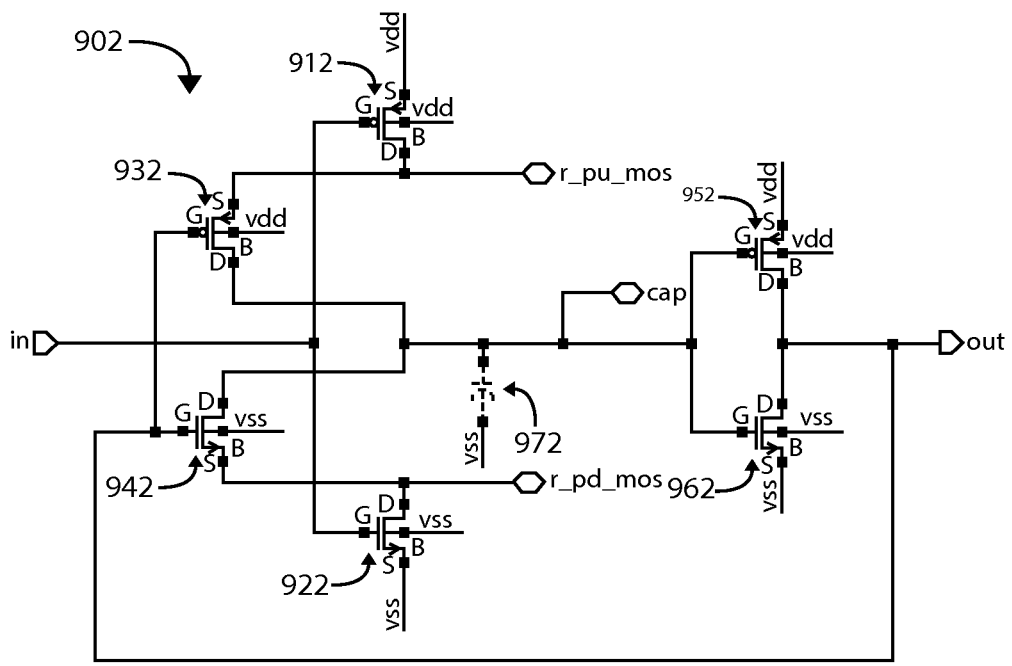

FIG. 9B is a simplified circuit diagram illustrating the skew mos module of FIG. 9A according to a specific embodiment. As shown, the circuit diagram includes three sets of pull-up/pull-down (PMOS/NMOS) transistor pairs, each transistor having a gate (G), a drain (D), a source (S), and a bulk node (B). In the first pair, the gates of the first PMOS 912 and first NMOS 922 are connected to the input node (in). The source and bulk of the first PMOS 912 are coupled to vdd, while the source and bulk of the first NMOS 922 are coupled to vss. Also, the drain of the first PMOS 912 is coupled to the pull-up node, while the drain of the first NMOS 922 is coupled to the pull-down node.

In the second pair, the source of the second PMOS 932 is coupled to the pull-up node and the source of the second NMOS 942 is coupled to the pull-down node. The gates of the second PMOS 932 and second NMOS 942 are connected to the output node. The drains of the second PMOS 932 and second NMOS 942 are coupled to the cap node. Also, the bulk of the second PMOS 932 is coupled to vdd, while the bulk of the second NMOS 942 is coupled to vss.

In the third pair, the drains of the third PMOS 952 and the third NMOS 962 are coupled to the output node. The source and bulk of the third PMOS 952 are coupled to vdd, while the source and bulk of the third NMOS 962 are coupled to vss. The gates of the third PMOS 952 and third NMOS 962 are coupled to the cap node. Furthermore, a capacitive load 972 can be coupled to the cap node and vss.

Figure 9C:
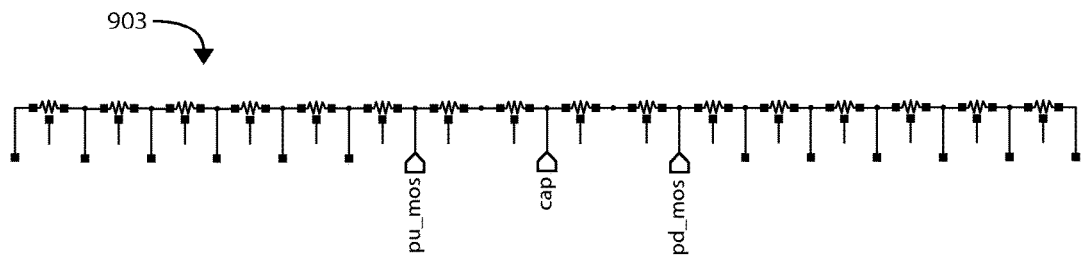

FIG. 9C is a simplified circuit diagram of the skew resistor module of FIG. 9A according to a specific embodiment. As shown, the skew resistor module includes a plurality of resistors coupled in series. The skew resistor module includes connections to the pull-up node, the pull-down node, and the cap node.

Figure 9D:
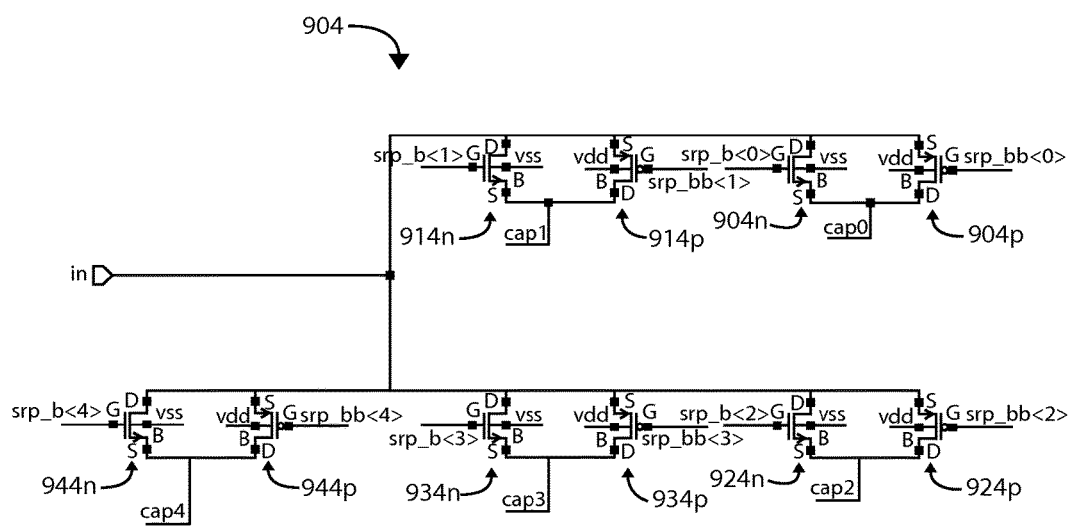

FIG. 9D is a simplified circuit diagram of the cap array module of FIG. 9A according to a specific embodiment. As shown, the cap array module includes five pairs of MOSFETS. Each pair includes a PMOS transistor and an NMOS transistor, each transistor having a gate (G), a drain (D), a source (S), and a bulk node (B). In FIG. 9D, the PMOS transistors are denoted as 904*p*, 914*p*, 924*p*, 934*p*, and 944*p*. Similarly, the NMOS transistors are denoted as 904*n*, 914*n*, 924*m*, 934*n*, and 944*n*, wherein the transistors with the same numbers are configured in pairs. In each pair, the source of the PMOS and the drain of the NMOS are coupled to the input node. For each pair, the source of the NMOS and the drain of the PMOS are coupled to different cap array node (first through fifth cap array node). The bulk of each PMOS is coupled to vdd, while the bulk of each NMOS is coupled to vss. The gates of each PMOS and NMOS are coupled to different elements of the array node.

The array node is denoted as srp_b[0:4] and srp_bb[0:4]. The gates of the PMOS and NMOS of the first pair are coupled to node srp_b<0> and node srp_bb<0>, respectively. The second pair are coupled to nodes srp_b<1> and srp_bb<1> in the same manner. This configuration continues up to nodes srp_b<4> and srp_bb<4> for the fifth MOSFET pair.

Figure 10B:
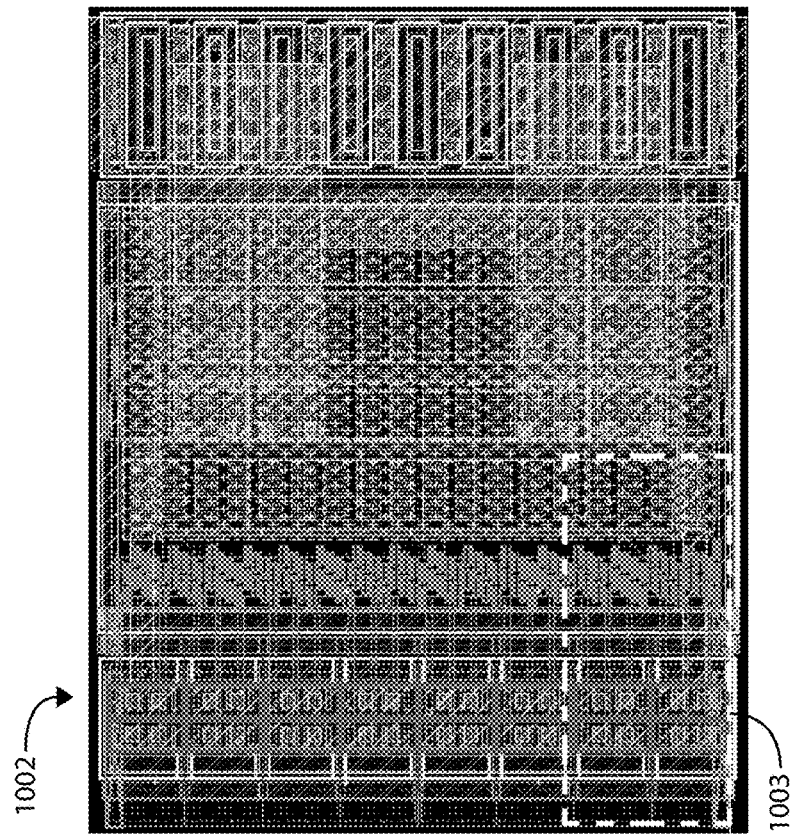
FIGS. 10A to 10C are simplified circuit diagrams illustrating a driver circuit according to an embodiment of the driver integrated circuit of FIG. 7.
Figure 10A:
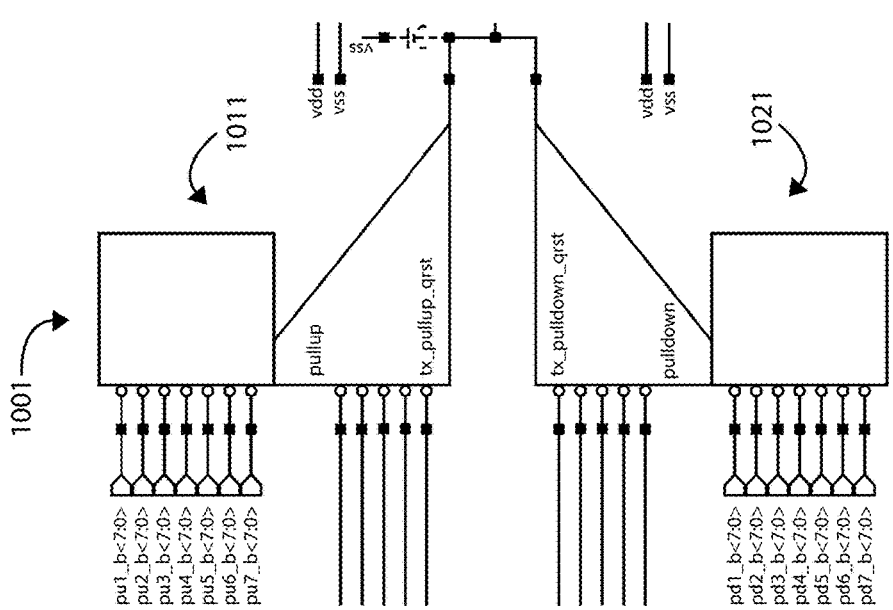

FIG. 10A is a simplified circuit diagram illustrating a driver circuit according to an embodiment of the driver integrated circuit of FIG. 7. As shown, the driver circuit implements split pull-up and pull-down coarse cells into eight branches with separate controls. The upper portion represents the pull-up driver 1011 with eight separate controls for the coarse cells and the lower portion represents the pull-down driver 1021 with similar eight controls for coarse cells. Although eight controls for each pull side are shown here, those of ordinary skill in the art will recognize variations in the number of controls depending on application.

Figure 10C:
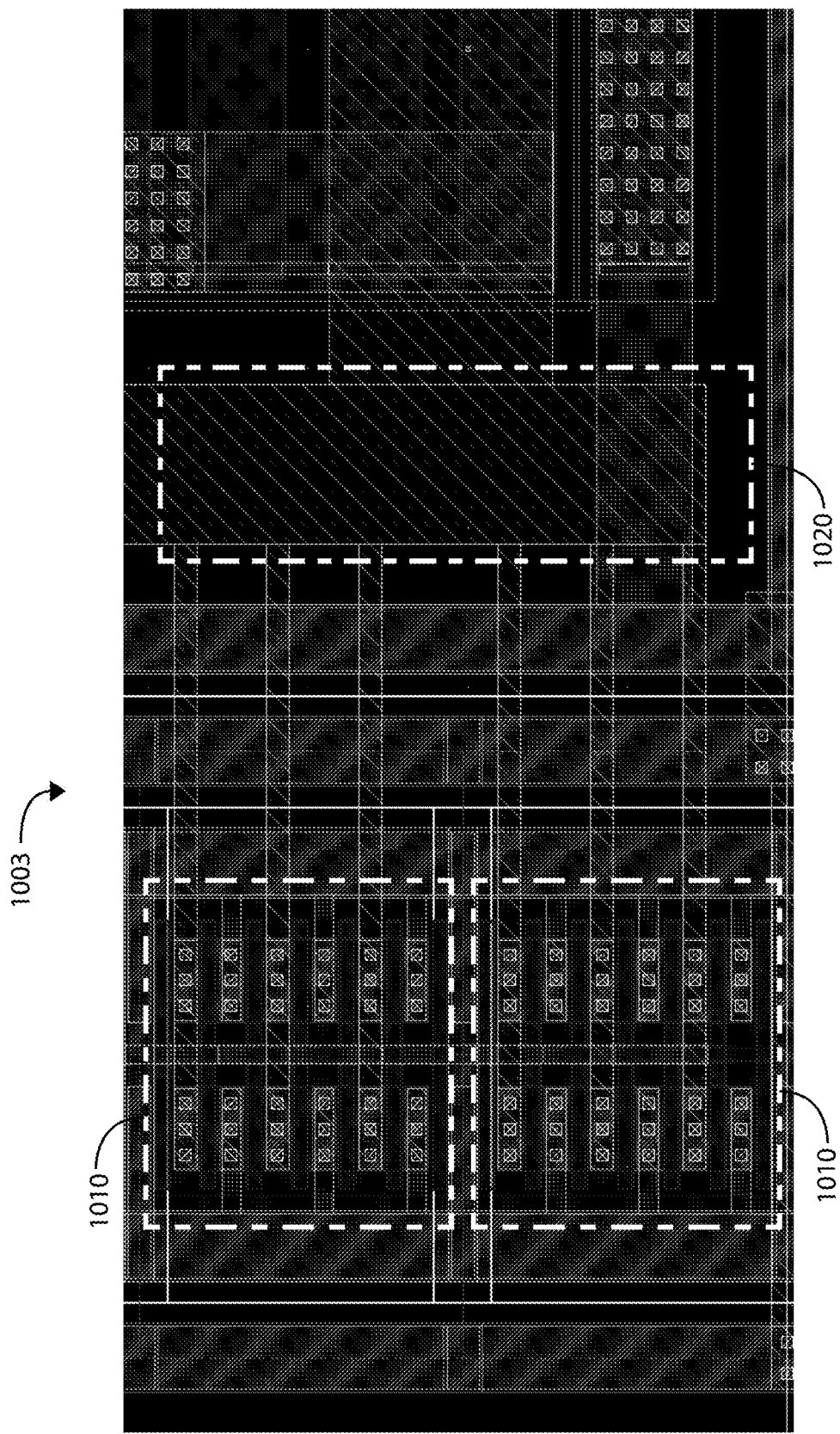

FIG. 10B is a circuit layout image representing an embodiment of the top portion of the driver circuit. FIG. 10C shows a close-up view of the same circuit layout image at region 1003. As described for FIG. 10A, one control is split into eight controls directed to eight groups of two transistors shown by regions 1010. The connection to resistors, shown at region 1020, is also split into eight groups, which are connected to the eight transistor pairs.

In an embodiment, the present invention provides a driver integrated circuit device. The driver device can include a front-end module, a pre-driver module, and a driver module coupled to a transmission line path. The pre-driver module can be coupled to the front-end module and can include one or more delay adjust capacitor modules, one or more pull-up control modules, and one or more pull-down control modules. The driver module can be coupled to the pre-driver module. The driver module can include one or more pull-up control logic modules and one or more pull-down control logic modules.

In a specific embodiment, each of the delay adjust capacitor modules can include a skew mos module, a skew resistor module, and a cap array module. The skew mos module can include a first transistor pair, a second transistor pair, and a third transistor pair configured to a mos input node, a mos output node, a cap node, a pull-up connection node, and a pull-down connection node. The skew resistor module can include a plurality of resistors coupled in a series connection and having a plurality of resistor connection nodes at each junction between the resistors and the ends of the series connection; wherein the nodes at each junction include a cap node, a pull-up connection node, and a pull-down connection node. The cap array module can include an array of transistor pairs configured to an array of cap connection nodes; wherein the cap array module includes a cap array input node coupled to a cap connection node.

In a specific embodiment, the one or more pull-up control modules includes one or more pull-up fine control modules and one or more pull-up coarse control modules. Also, the one or more pull-down control modules includes one or more pull-down fine control modules and one or more pull-down coarse control modules.

In a specific embodiment, the transmission line path is a multi-load transmission line path that is unterminated. The transmission line can have a first portion and a second portion, wherein the first portion is configured to one or more database loads and the second portion is configured to one or more database loads.

Figure 11:
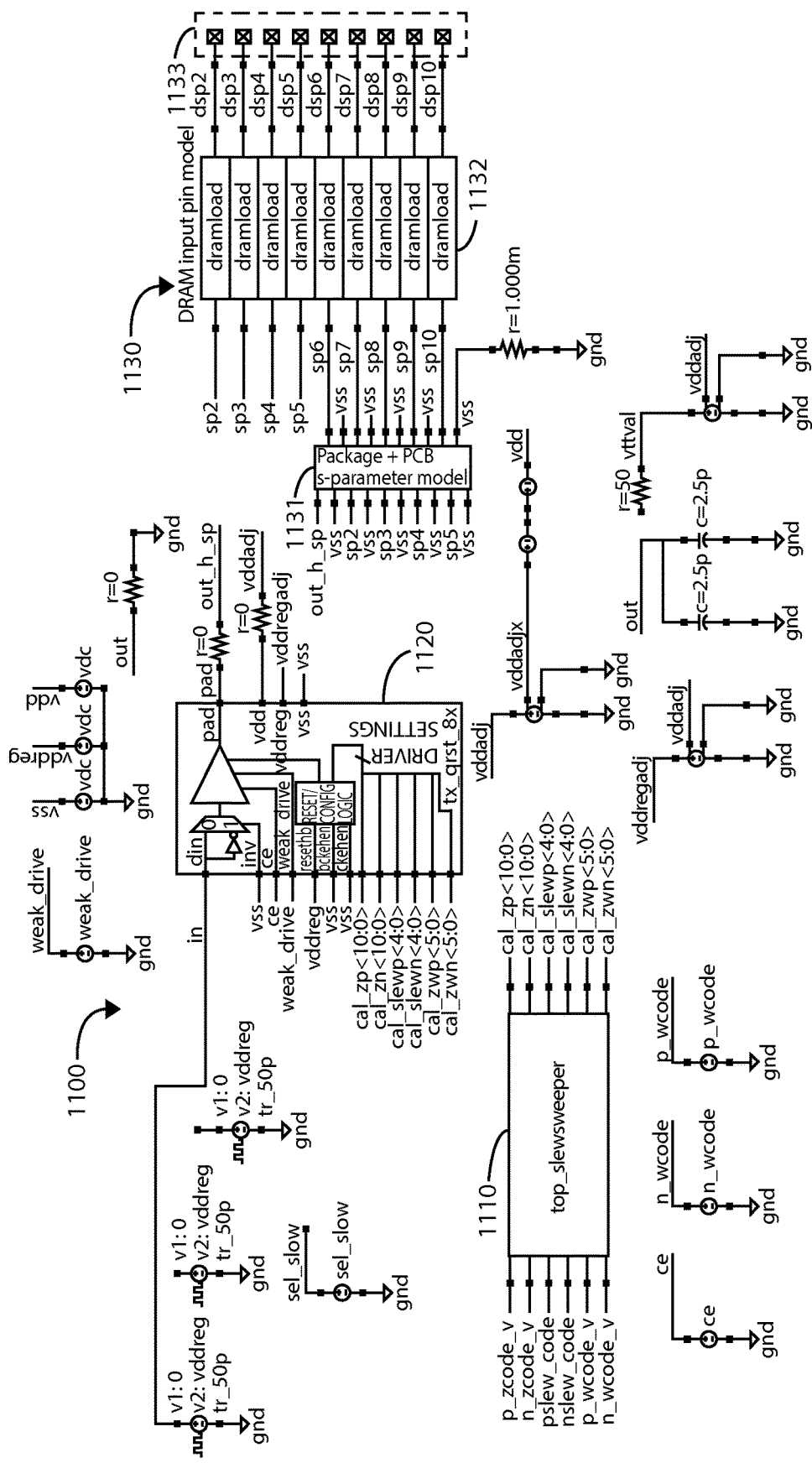
FIG. 11 is a simplified circuit diagram illustrating a test bench simulation of a driver integrated circuit according to an embodiment of the present invention.

FIG. 11 is a simplified circuit diagram illustrating a test bench simulation of a driver integrated circuit according to an embodiment of the present invention. As shown, test circuit configuration 1100 shows a test slew sweeper module 1110 coupled to a QRST driver 1120 coupled to a test model module 130. The connected inputs are shown by the labeling of the inputs/outputs of each module. The test model module 130 includes a PCB parameter model 1131 coupled to a DRAM input pin model 1132. Transient responses are measured at region 1133 and are shown in the following figures.

FIGS. 12A to 12D are simplified graphs representing test bench simulations according to the driver integrated circuit of FIG. 11. FIGS. 12A and 12B show the simulation calibrated to a slow edge mode (slew rate=0.5V/ns) and FIGS. 12C and 12D show the simulation calibrated to a JEDEC minimum slew rate mode (slew rate=2V/ns). Also, each of these graphs were tested at a control setting denoted with a two letter code, a voltage setting, and a capacitance setting. FIGS. 12A and 12C were tested with the same control settings, denoted as "Corner: tt, 1.2V, 65C". Similarly, FIGS. 12C and 12D were tested with the same control settings, debited as "Corner: ff, 1.32V, 0C".

Figure 13A:
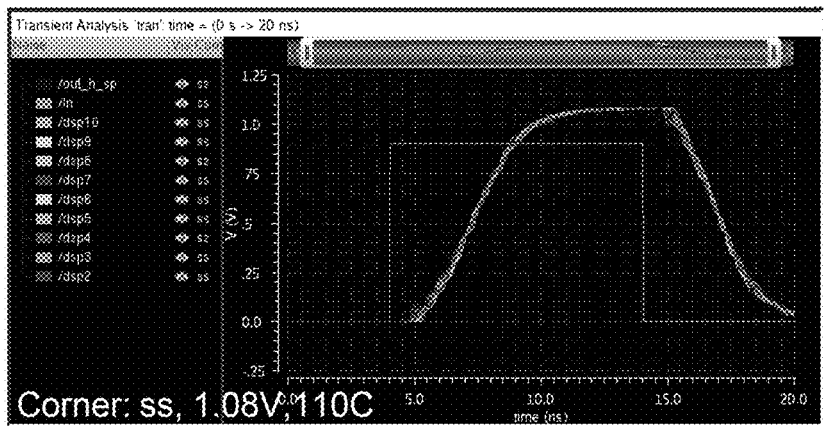
FIGS. 13A to 13C are simplified graphs representing test bench simulations according to the driver integrated circuit of FIG. 11.
Figure 13B:
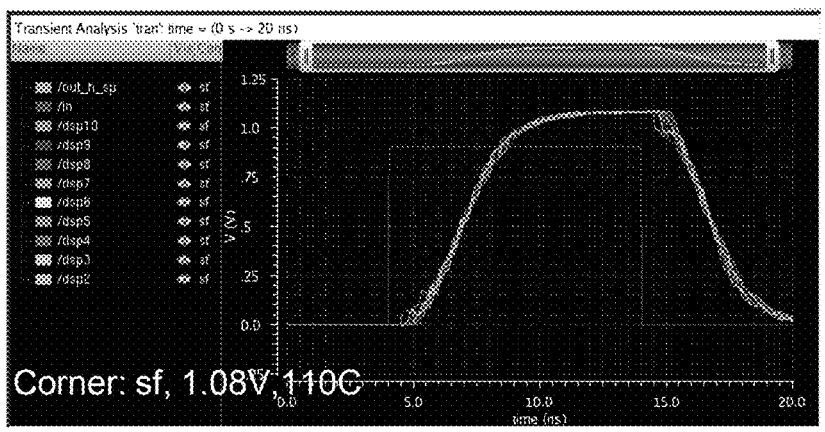
Figure 13C:
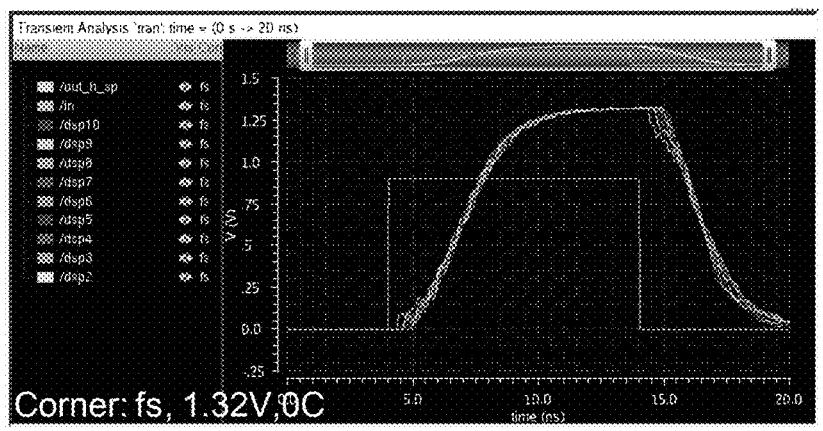

FIGS. 13A to 13C are simplified graphs showing simulations calibrated to a slow edge mode. FIG. 13A was tested with control settings denoted as "Corner: ss, 1.08V, 110C". FIG. 13B was tested with control settings denoted as "Corner: sf, 1.08V, 110". FIG. 13C was tested with control settings denoted as "Corner: fs, 1.32V, 0C".

Figure 14A:
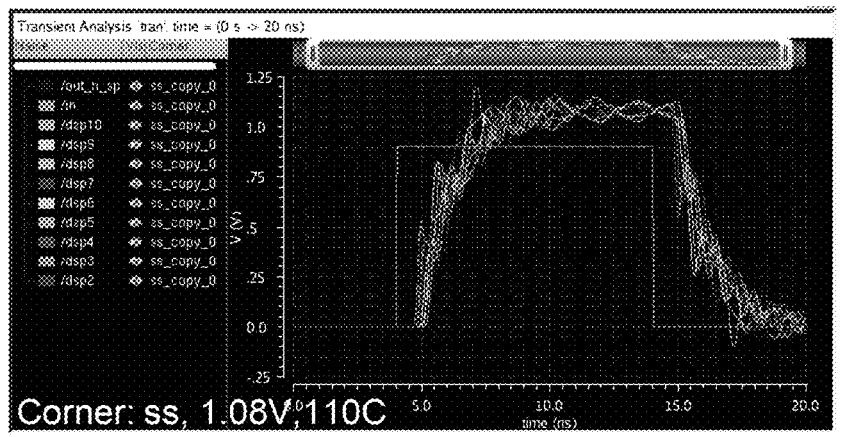
FIGS. 14A to 14C are simplified graphs representing test bench simulations according embodiments of the present invention.
Figure 14B:
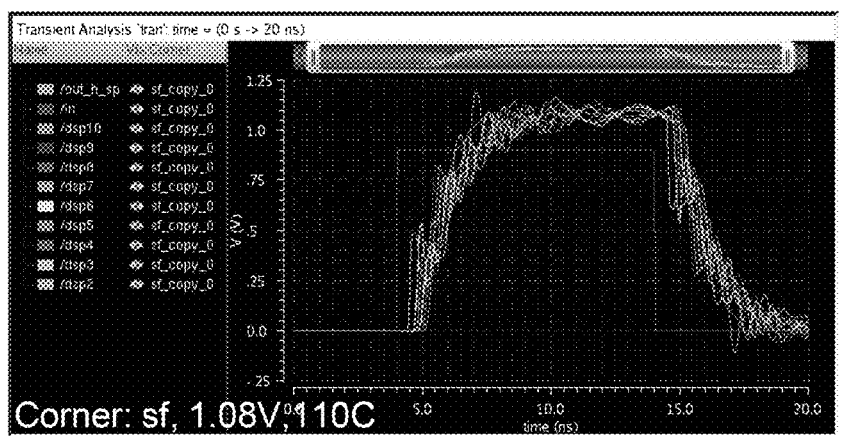
Figure 14C:
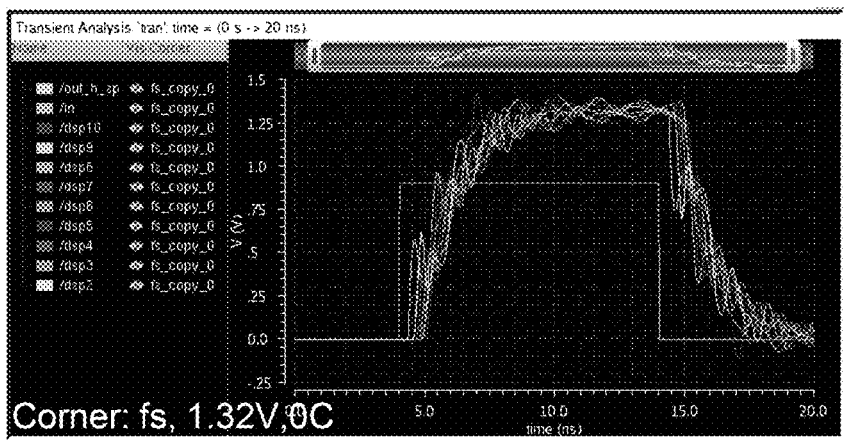

FIGS. 14A to 14C are simplified graphs showing simulations calibrated to a JEDEC minimum slew rate mode with similar control settings as FIGS. 13A-13C. FIG. 14A was tested with control settings denoted as "Corner: ss, 1.08V, 110C". FIG. 14B was tested with control settings denoted as "Corner: sf, 1.08V, 110". FIG. 14C was tested with control settings denoted as "Corner: fs, 1.32V, 0C".

Figures 15A, 15B, 15C:
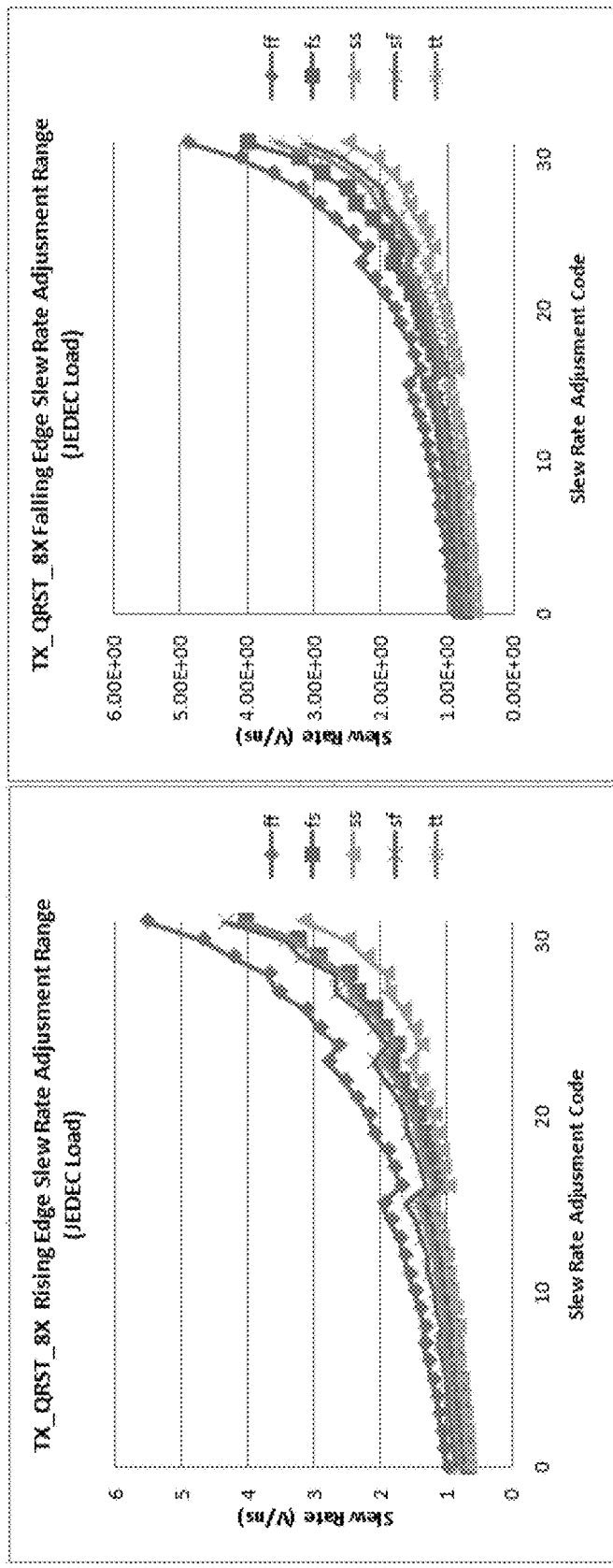
FIGS. 15A to 15C represent results from test bench simulations according to an embodiment of the present invention.

FIGS. 15A to 15C represent results from test bench simulations for the QRST driver according to an embodiment of the present invention. FIG. 15A is a table including summarized results from the test simulations shown previously. FIG. 15B is a slew rate adjustment range graph showing slew rate over adjustment code for the rising edge. FIG. 15C is a slew rate adjustment range graph showing slew rate over adjustment code for the falling edge.

Figure 16:
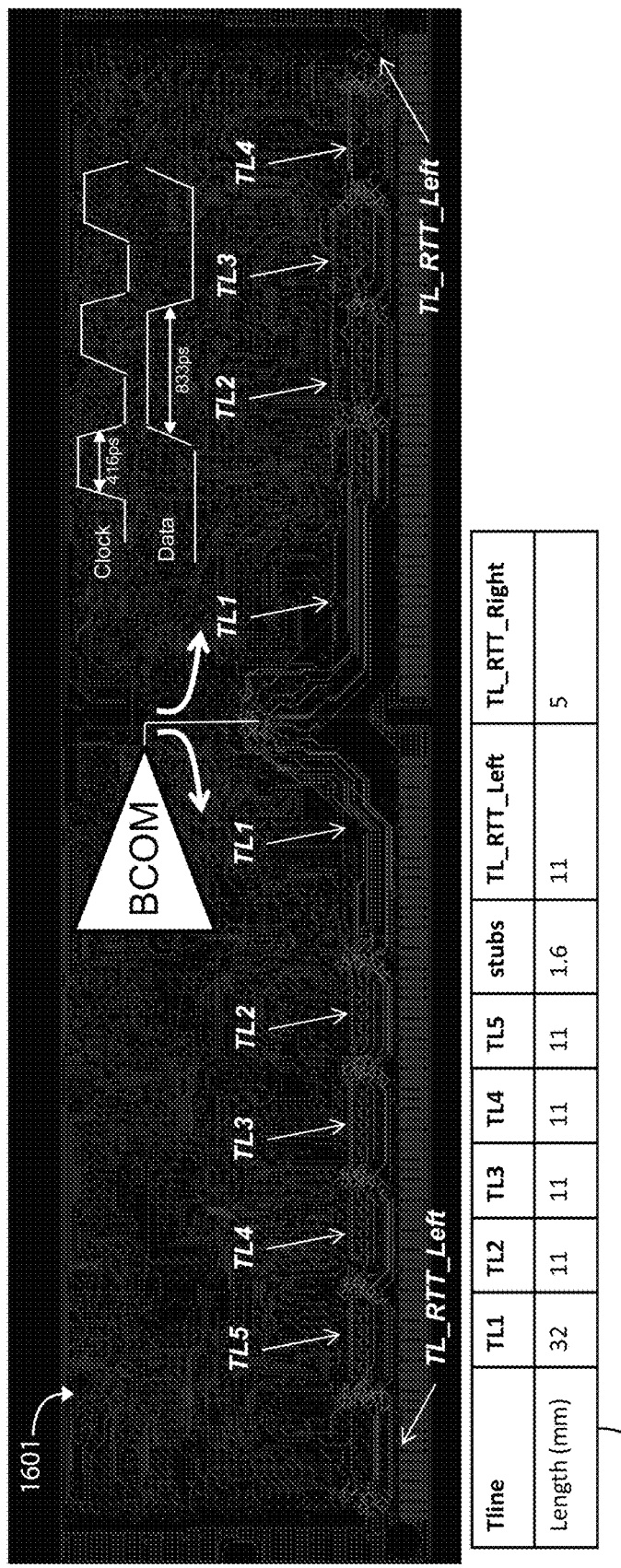
FIG. 16 is a simplified diagram of a driver integrated circuit according to an embodiment of the present invention.

FIG. 16 is a simplified diagram of a driver integrated circuit according to an embodiment of the present invention. As shown in diagram 1601, there are five DB loads to the left and four DB loads to the right. 40 Ohms termination resistors are configured at the left and right ends of the transmission lines. In comparison to this driver, the QRST driver has similar routing, but is unterminated, which needs lower slew rates to have monotonic rise/fall transition edges at the loads. As an example, the transmission line segment lengths are provided below in the table 1602.

FIGS. 17A to 17C are simplified circuit diagrams illustrating a driver integrated circuit according to an embodiment of the present invention. More specifically, FIG. 17A is a simplified circuit diagram illustrating a BCOM driver circuit. Similar to FIG. 9B, the circuit diagram 1701 includes three sets of pull-up/pull-down (PMOS/NMOS) transistor pairs, each transistor having a gate (G), a drain (D), a source (S), and a bulk node (B). In the first pair, the gates of the first PMOS 1711 and first NMOS 1721 are connected to the input node. The source and bulk of the first PMOS 1711 are coupled to vdd, while the source and bulk of the first NMOS 1721 are coupled to vss. Also, the drain of the first PMOS 1711 is coupled to the pull-up node, while the drain of the first NMOS 1721 is coupled to the pull-down node.

In the second pair, the source of the second PMOS 1731 is coupled to the pull-up node and the source of the second NMOS 1741 is coupled to the pull-down node. The gates of the second PMOS 1731 and second NMOS 1741 are connected to the output node. The drains of the second PMOS 1731 and second NMOS 1741 are coupled to the cap node. Also, the bulk of the second PMOS 1731 is coupled to vdd, while the bulk of the second NMOS 1741 is coupled to vss.

In the third pair, the drains of the third PMOS 1751 and the third NMOS 1761 are coupled to the output node. The source and bulk of the third PMOS 1751 are coupled to vdd, while the source and bulk of the third NMOS 1761 are coupled to vss. The gates of the third PMOS 1751 and third NMOS 1761 are coupled to the cap node. Also similar to FIG. 9B, a capacitor load 1771 can be coupled to the cap node and vss. However, this driver additionally includes binary weighted resistor circuit 1781 coupled to the pull-up node and the pull-down node.

FIG. 17B is a simplified circuit diagram illustrating the binary weight resistor circuit of FIG. 7A according to a specific embodiment. As shown, the resistor circuit 1703 includes a plurality of resistors coupled in series with one end connected to the pull-up node and one end coupled to the pull-down node. Pull-up and pull-down tap nodes (pu_tap and pd_tap) are also configured at each junction between resistors.

FIG. 17C is a simplified circuit diagram illustrating a tap array module according to an embodiment of the present invention. As shown, this tap array module 1702 includes four pull-up transistors (PMOS), numbered from 1704p-1734p, and four pull-down transistors (NMOS), numbered from 1704n-1734n. The bulk of each PMOS is coupled to vdd, while the bulk of each NMOS is coupled to vss. The PMOS transistors are coupled in series with the drain of one PMOS connected to the source of the next PMOS. Each drain and source are also connected to a pu_tap[0:4] node, which is coupled to the respective node shown in the resistor circuit of FIG. 7B. Also, the gates of each PMOS are coupled to different pull up elements of the array node, denoted by srp_b[0:4].

Similarly, the NMOS transistors are coupled in series with source of one NMOS connected to the drain of the next NMOS. Each drain and source are also connected to a pd_tap[0:4] node, which is coupled to the respective node shown in the resistor circuit of FIG. 7B. Also, the gates of each NMOS are coupled to a different pull-down elements of the array node, denoted by srp_bb[0:4].

Figure 18A:
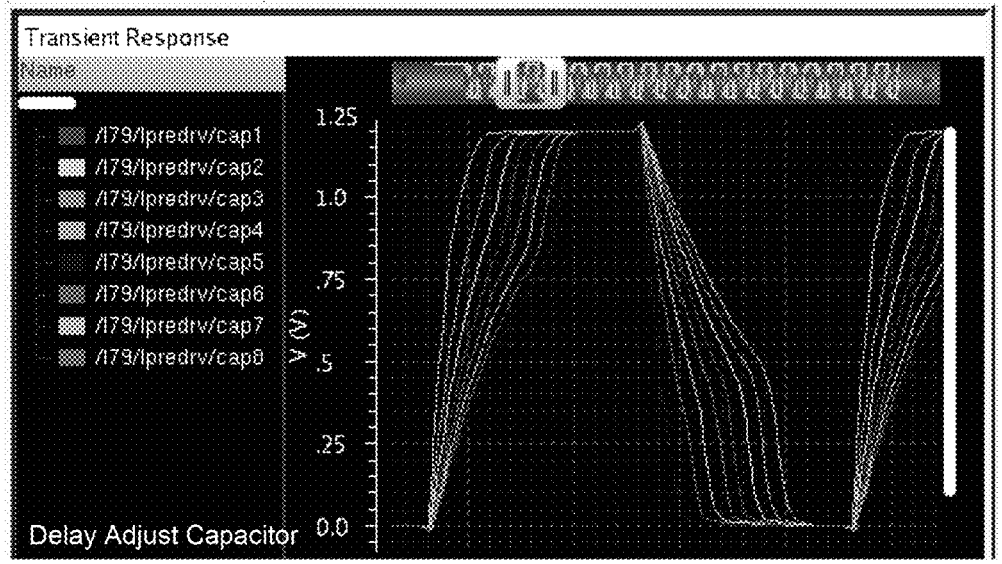
FIGS. 18A and 18B are simplified graphs representing transient responses according to the driver integrated circuit of FIGS. 17A to 17C.
Figure 18B:
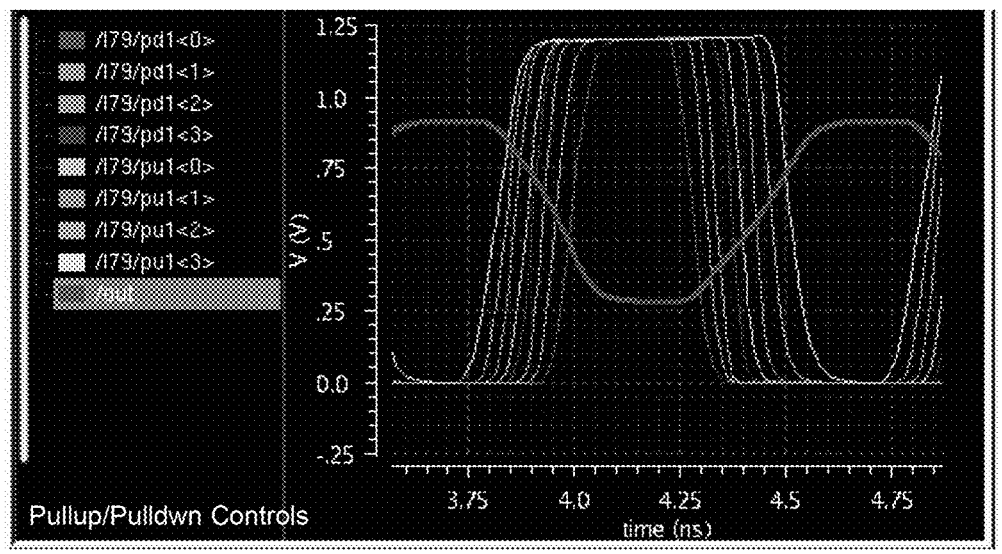

FIGS. 18A and 18B are simplified graphs representing transient responses according to the driver integrated circuit of FIGS. 17A to 17C. These graphs can represent results from using a test configuration similar to that shown in FIG. 11. FIG. 18A shows the transient response for the delay-adjust capacitor modules and FIG. 18B shows the transient response for the pull-up/pull-down controls. In FIG. 18B, the output waveform is shown with the controls, illustrating the behavior described in FIG. 5B. The pull-up signals turn off sequentially and the pull-down signals turn on sequentially, resulting the in the output wave having a lower slew rate and a more gradual sloping.

FIGS. 19A to 19C are simplified circuit diagrams illustrating a driver integrated circuit according to an embodiment of the present invention. FIGS. 19A and 19B illustrate portions of a pre-driver module similar to that shown in FIG. 8. FIG. 19A is a simplified block diagram illustrating a delay adjust capacitor module 1901, including several delay adjust capacitor cells, which corresponds to the transient response graph of FIG. 18A.

FIG. 19B shows pull-up and pull-down control modules 190, including coarse and fine control modules, which corresponds to the transient response graph of FIG. 18B. As shown, the pull-up control modules can include fine pull-up control modules 1912 and coarse pull-up control modules 1932. Similarly, the pull-down control modules can include fine pull-down control modules 1922 and coarse pull-down control modules 1942. This configuration is similar to control modules of the QRST driver shown in FIG. 8.

FIG. 19C shows a driver circuit similar to that shown in FIG. 10A. As shown, the driver circuit 1903 implements split pull-up and pull-down coarse cells into eight branches with separate controls. The driver 1913 is coupled to an upper portion and a lower portion. The upper portion represents the pull-up driver 1923 with eight separate controls for the coarse cells and the lower portion represents the pull-down driver 1933 with similar eight controls for coarse cells. Although eight controls are shown for each driver, those of ordinary skill in the art will recognize other variations, modifications, and alternatives.

Figure 20:
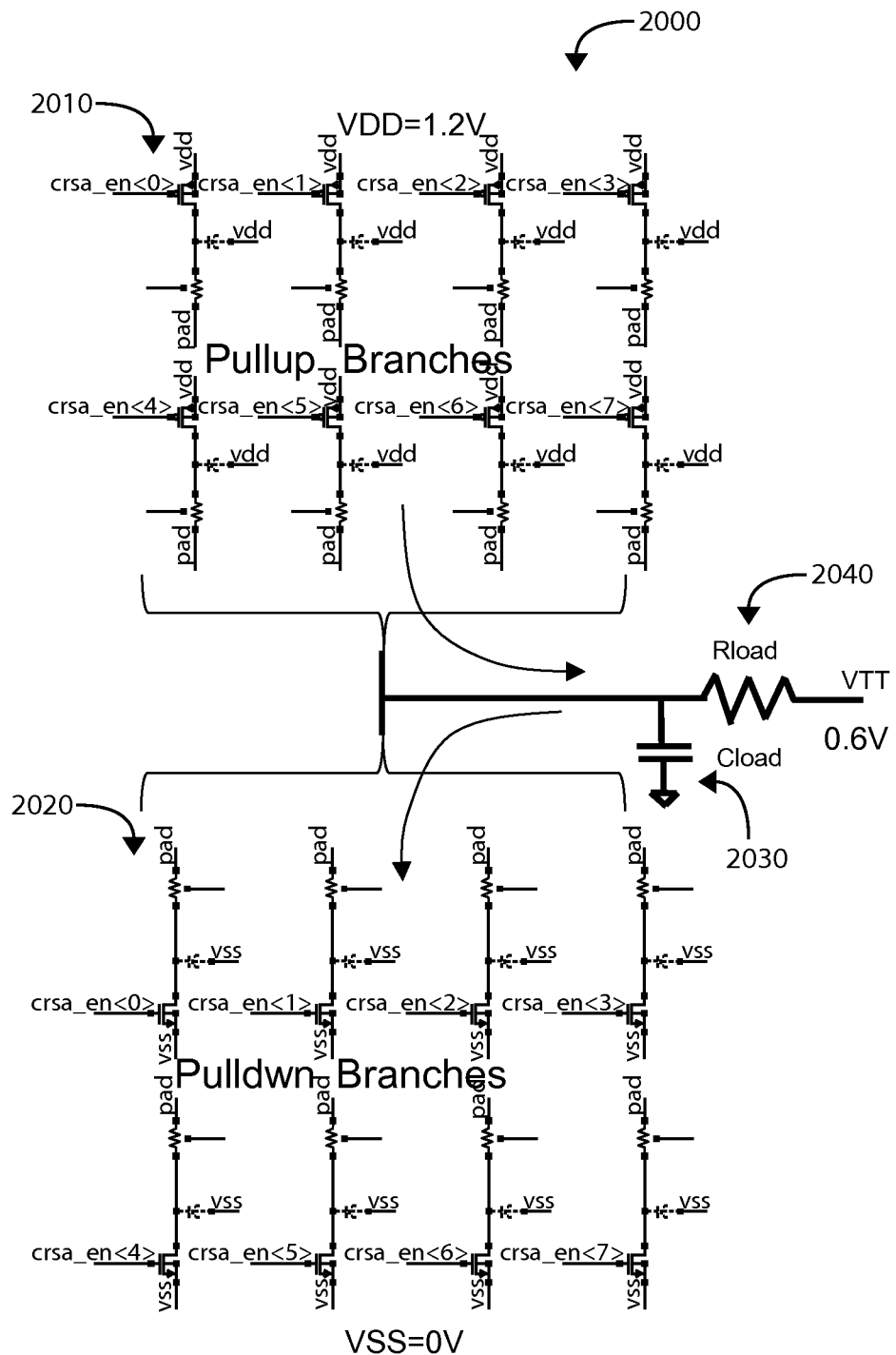
FIG. 20 is a simplified circuit diagram illustrating a driver integrated circuit according to an embodiment of the present invention.

FIG. 20 is a simplified circuit diagram illustrating a driver integrated circuit 2000 according to an embodiment of the present invention. This circuit diagram shows the configuration of pull-up branches 2010 and pull-down branches 2020 coupled to a capacitive load 2030 on a transmission line terminated to a resistive load 2040, similar to FIG. 5A.

In an embodiment, the present invention provides a driver integrated circuit device. The driver device can include a front-end module, a pre-driver module, and a driver module coupled to a transmission line path. The pre-driver module can be coupled to the front-end module and can include one or more delay adjust capacitor modules, one or more pull-up control modules, and one or more pull-down control modules. The driver module can be coupled to the pre-driver module. The driver module can include one or more pull-up control logic modules and one or more pull-down control logic modules.

In a specific embodiment, each of the delay adjust capacitor modules can include a skew mos module, a skew resistor module, and a cap array module. The skew mos module can include a first transistor pair, a second transistor pair, and a third transistor pair configured to a mos input node, a mos output node, a cap node, a pull-up connection node, and a pull-down connection node. The skew resistor module includes a plurality of binary weight resistors coupled in a series connection and having a plurality of resistor connection nodes at each junction between the resistors and the ends of the series connection; wherein the plurality of resistor connection nodes include resistor pull-up connection nodes and resistor pull-down connection nodes. The cap array module includes an array of pull-up transistors in a chain configuration and an array of pull-down transistors in a chain configuration; wherein the array of pull-up transistors are configured to the plurality of resistor pull-up connection nodes and the array of pull-down transistors are configured to the plurality of resistor pull-down connection nodes.

In a specific embodiment, the one or more pull-up control modules includes one or more pull-up fine control modules and one or more pull-up coarse control modules. Also, the one or more pull-down control modules includes one or more pull-down fine control modules and one or more pull-down coarse control modules.

In a specific embodiment, the transmission line path is a multi-load transmission line path that is terminated. The transmission line can have a first portion and a second portion, wherein the first portion is configured to one or more database loads and the second portion is configured to one or more database loads.

Figure 21:
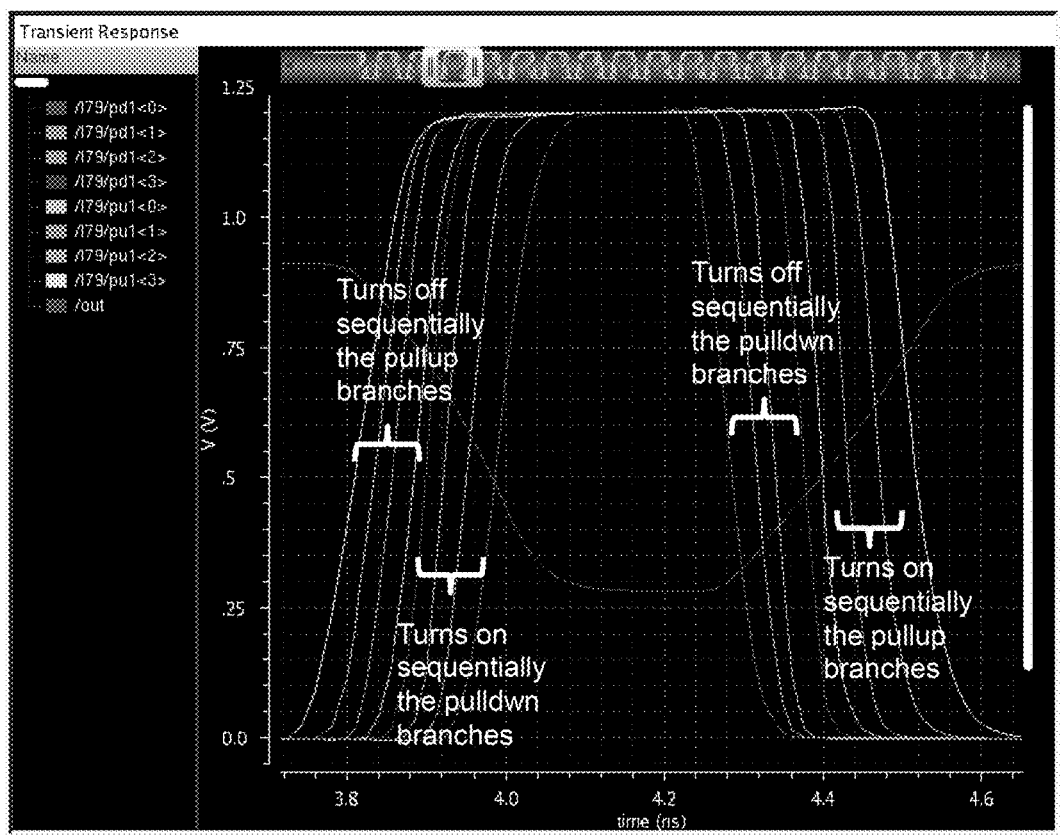
FIG. 21 is a simplified graph representing a transient response according to the driver integrated circuit of FIG. 20.

FIG. 21 is a simplified graph representing a transient response according to the driver integrated circuit of FIG. 20. This graph shows the operation described in FIG. 5B. In a first phase, the pull-up branches are turned off sequentially and the pull-down branches are turned on sequentially. In a second phase, the pull-down branches are turned off sequentially and the pull-up branches are turned on sequentially.

FIGS. 22A to 22D are simplified graphs representing transient responses for a driver integrated circuit according embodiments of the present invention. These show the operation of separate controls for slew rate adjustment on rising and falling edges. FIGS. 22A and 22B show the transient responses for the delay adjust capacitor and pull-up/pull-down controls for rising edges, respectively. FIGS. 22C and 22D show the transient responses for the same two circuit modules, but for falling edges.

Figures 23A, 23B:
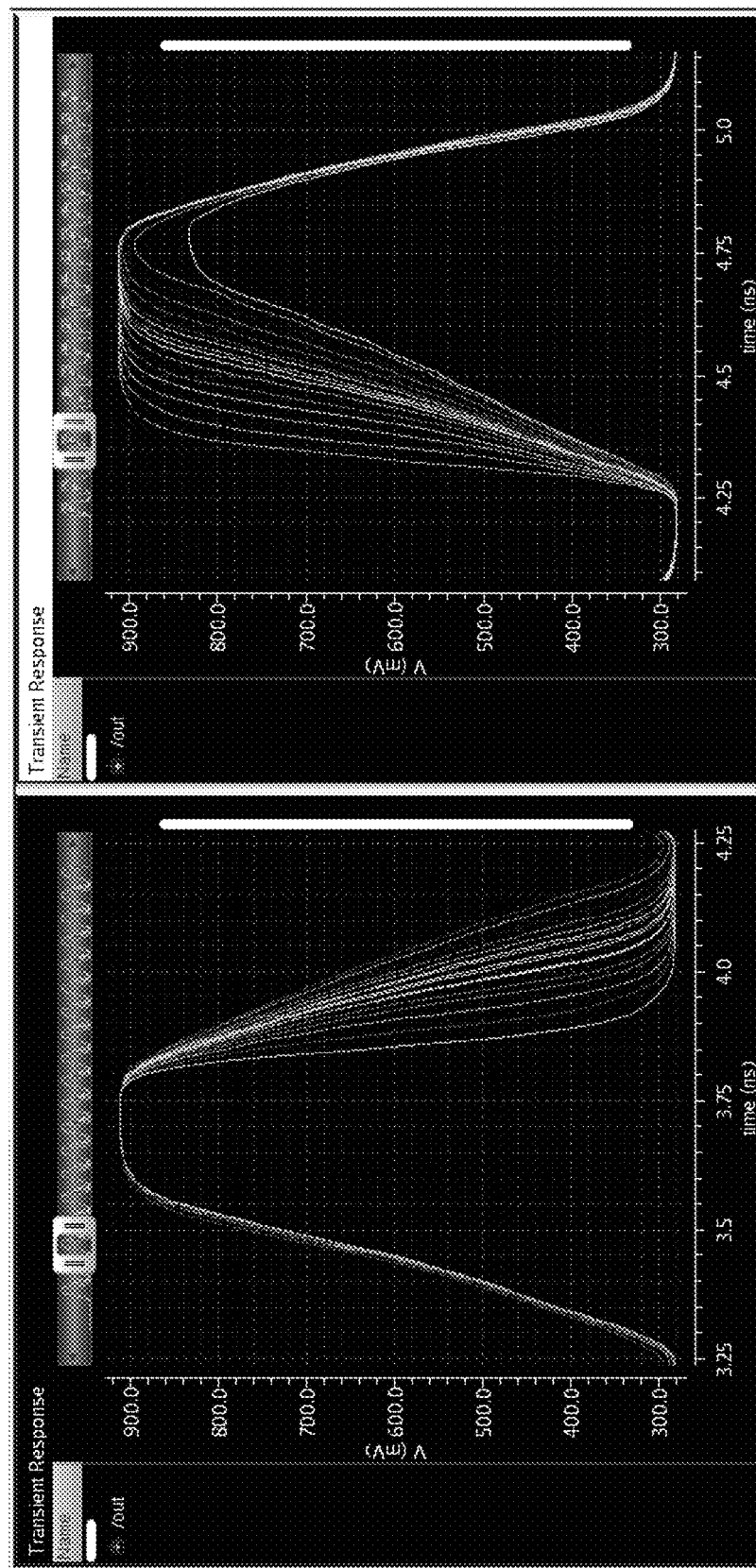
FIGS. 23A and 23B are simplified graphs representing transient responses according to a driver integrated circuit according to embodiments of the present invention.

FIGS. 23A and 23B are simplified graphs representing transient responses according to a driver integrated circuit according to embodiments of the present invention using a 20 Ohms load. FIG. 23A shows an output waveform with slew rate adjusted falling edges, while FIG. 23B shows an output waveform with slew rate adjusted rising edges.

Figures 24A, 24B:
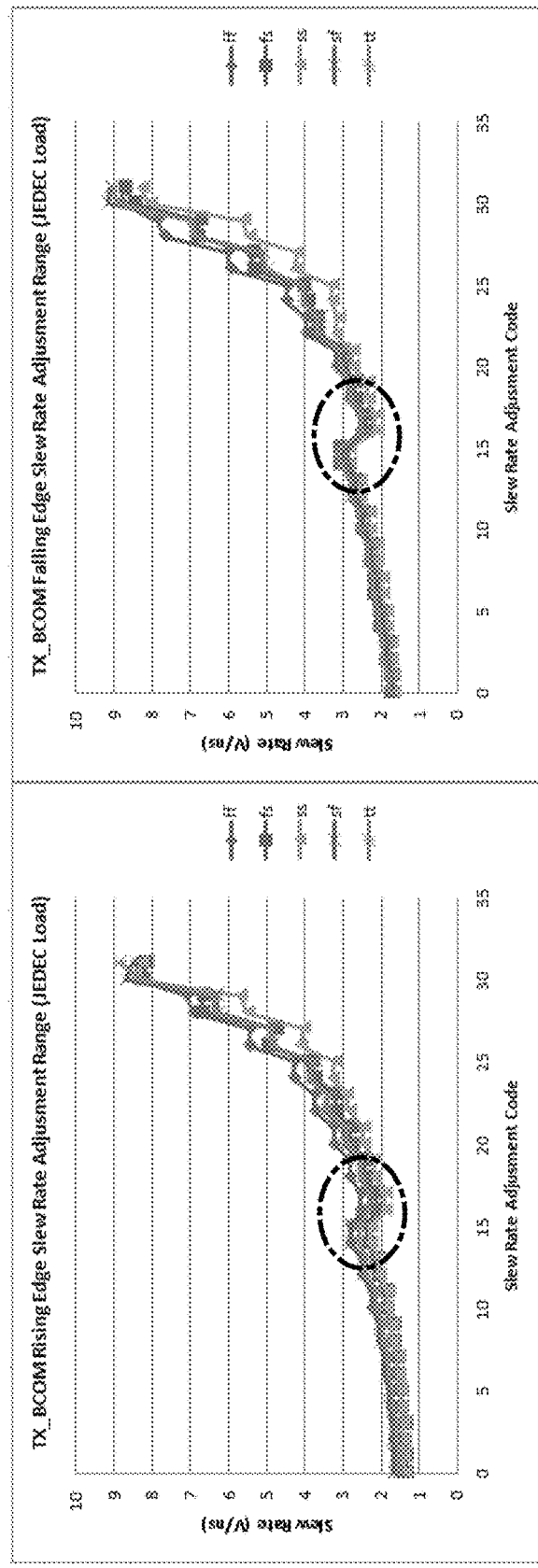
FIGS. 24A and 24B are simplified graphs representing slew rate adjustment range according to embodiments of the present invention.

FIGS. 24A and 23B are simplified graphs representing slew rate adjustment range for the BCOM driver according to embodiments of the present invention. FIG. 24A is a slew rate adjustment range graph showing slew rate over adjustment code for the rising edge. FIG. 24B is a slew rate adjustment range graph showing slew rate over adjustment code for the falling edge.

FIGS. 25A to 25D are simplified graphs representing transient responses for an ALERTn driver integrated circuit according to embodiments of the present invention. Each of these graphs shows is different output waveform according to a different slew adjustment configuration. In a specific embodiment, the slew rate adjustment is controlled by control bits. Considering that the ALERTn driver, shown in FIGS. 6A and 6B, included only pull-down transistors, these different graphs show the operation of using different pull-down control bits.

Figure 26:
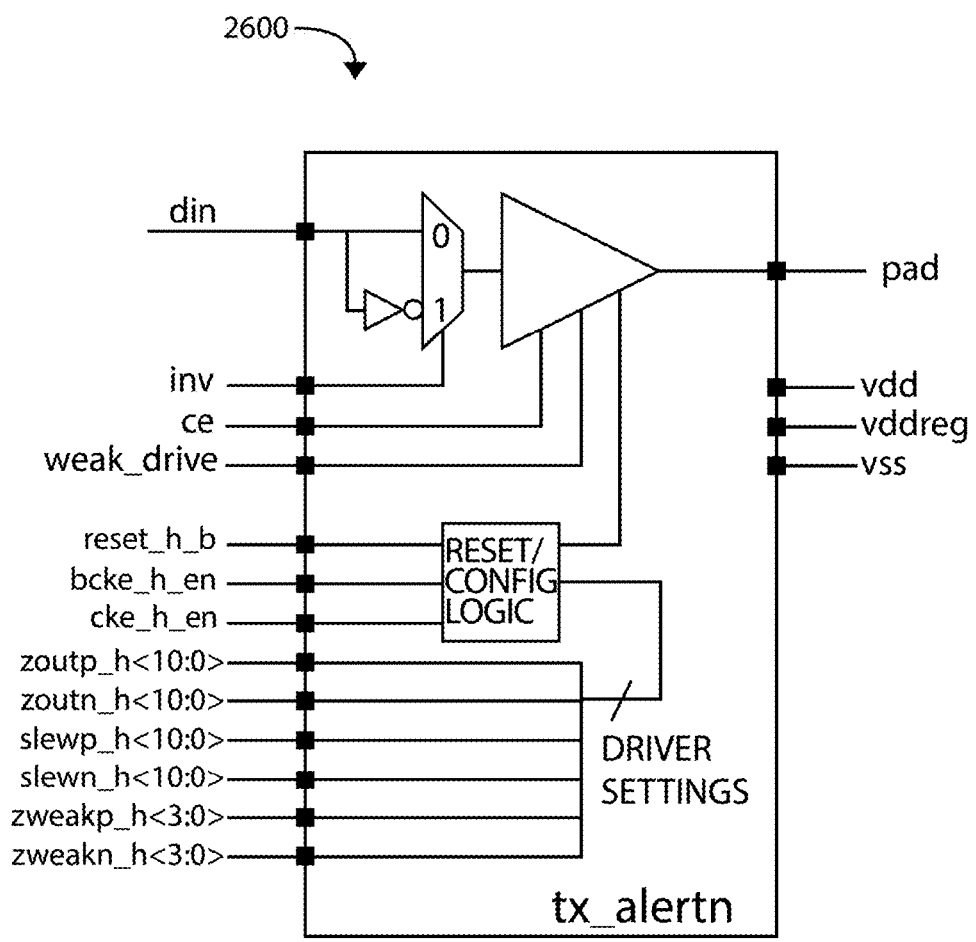
FIG. 26 is a simplified block diagram illustrating a driver integrated circuit according to an embodiment of the present invention.

FIG. 26 is a simplified block diagram illustrating a driver integrated circuit according to an embodiment of the present invention. As shown, this figure shows an ALERTn driver integrated circuit module 2600. The driver IC module includes a reset/config logic module having driver settings inputs, similar to the previous drivers.

Figure 27:
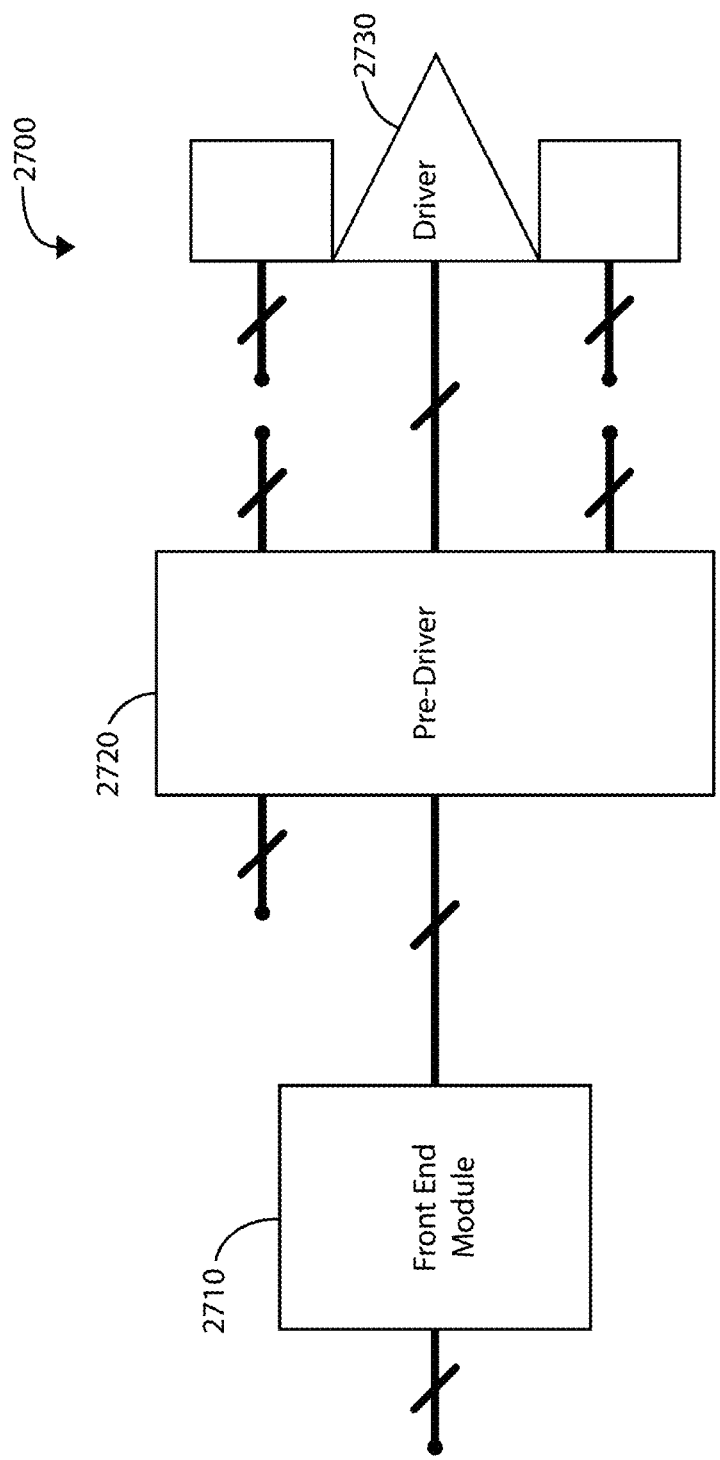
FIG. 27 is a simplified block diagram illustrating a driver integrated circuit according to an embodiment of the present invention.

FIG. 27 is a simplified block diagram illustrating a driver integrated circuit according to an embodiment of the present invention. This block diagram 2700 shows a different representation of the driver IC module shown in FIG. 26. Similar to FIG. 7, the driver IC module includes a front-end module 2710, a pre-driver module 2720, and a driver module 2730.

Figure 28:
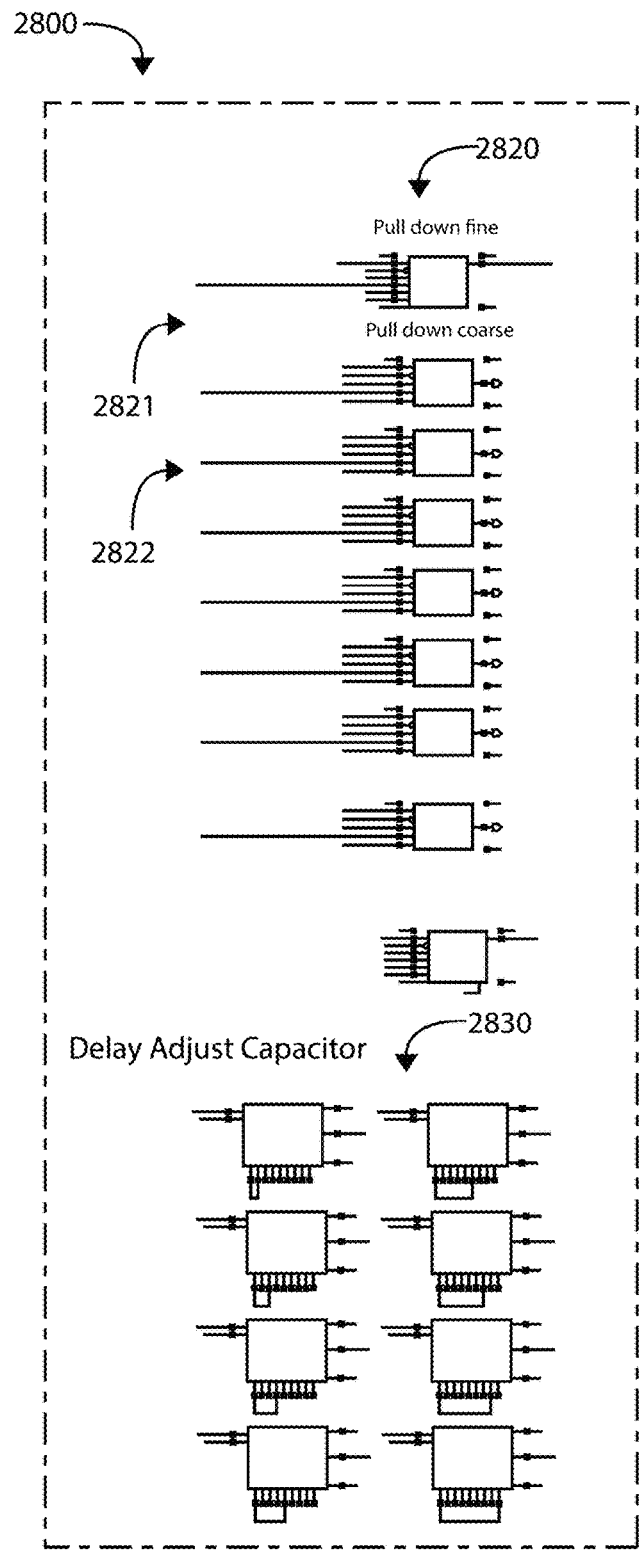
FIG. 28 is a simplified circuit diagram illustrating a driver integrated circuit according to an embodiment of the present invention.

FIG. 28 is a simplified circuit diagram illustrating a pre-driver module according to an embodiment of the present invention. Similar to FIG. 8, the pre-driver module 2800 for the ALERTn driver includes control modules 2820 and delay adjust capacitor modules 2830, but, in this case, the pre-driver only includes fine pull-down control modules 2821 and fine pull-down control modules 2822.

Figure 29A:
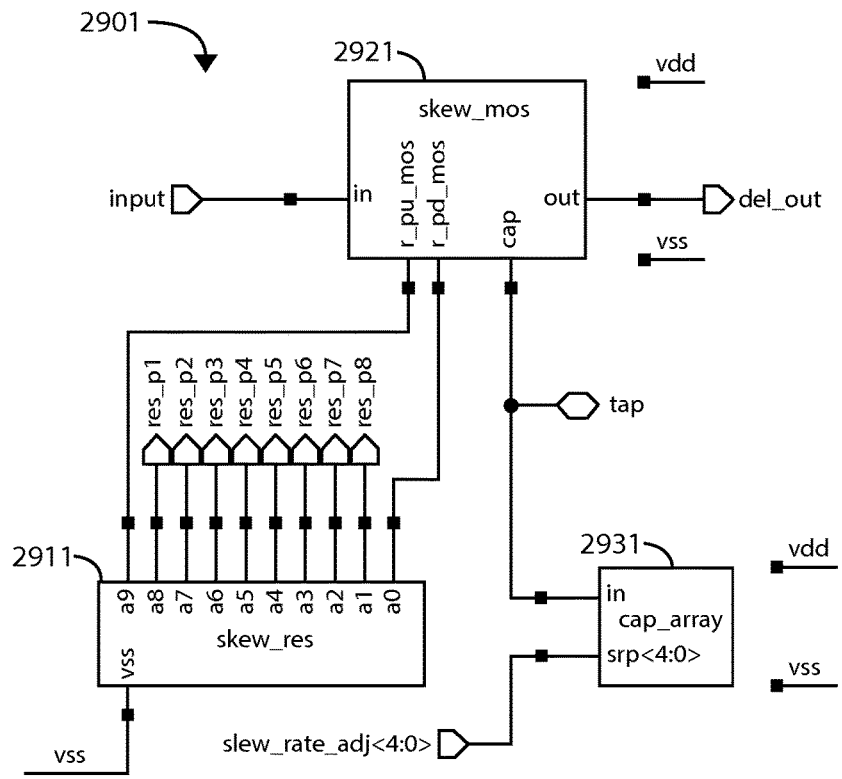
FIGS. 29A to 29D are simplified circuit diagrams illustrating a driver integrated circuit according to embodiments of the present invention.

FIGS. 29A to 29D are simplified circuit diagrams illustrating a driver integrated circuit according to embodiments of the present invention. FIG. 29A is a simplified block diagram illustrating the ALERTn driver module according to a specific embodiment. Similar to FIG. 9A (QRST), the driver module 2901 includes a skew resistor module 2911, a skew mos module 2921, and a cap array module 2931. The skew mos module 2921 and cap array module 2931 have the same connections as the embodiment shown in FIG. 9A. However, the skew resistor module 2911 has different connection nodes. Here, the skew resistor module 2911 includes a vss node as well as resistor array nodes denoted as nodes a0 to a9.

Figure 29B:
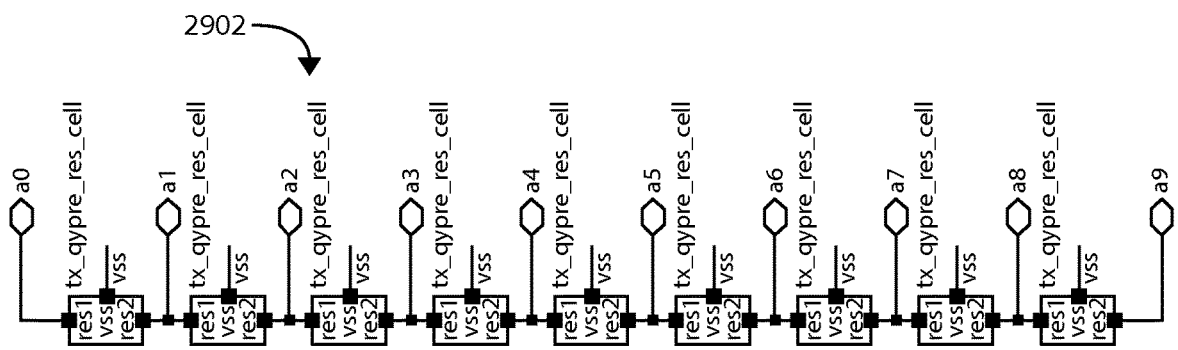

FIG. 29B is a simplified block diagram illustrating the skew resistor module of FIG. 29A according to a specific embodiment. As shown, the skew resistor module 2902 includes resistor cells that are coupled in series with resistor array connection nodes at each junction from a0 to a9. Referring back to FIG. 29A, the connection nodes a0 and a9 are coupled to the pull-down node and pull-up node of the skew mos module 2921, respectively.

Figure 29C:
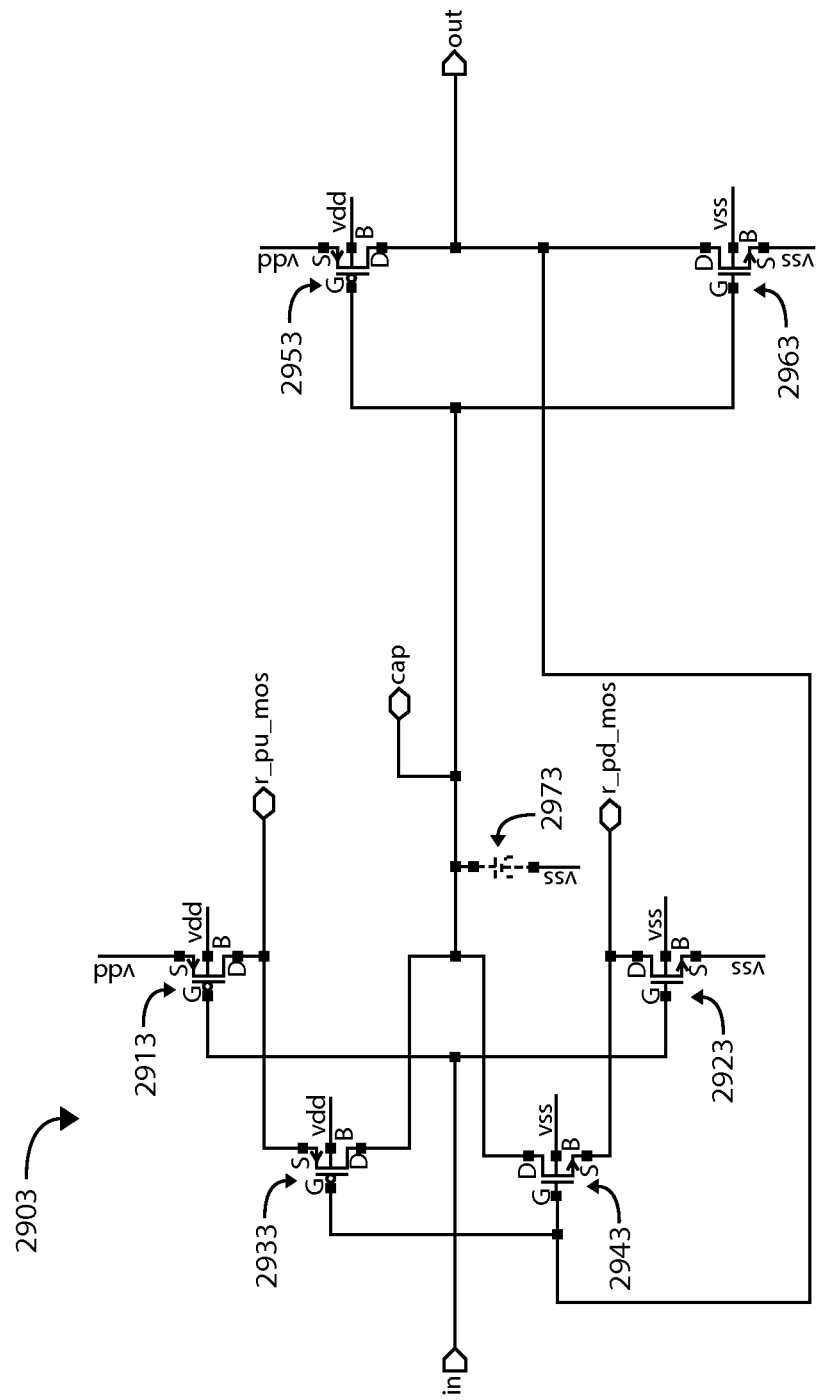

FIG. 29C is a simplified circuit diagram illustrating the skew mos module of FIG. 29A according to a specific embodiment. As shown, this module shows a similar configuration to the skew mos module of FIG. 9B for the QRST driver. Here, the circuit diagram 2903 includes three sets of pull-up/pull-down (PMOS/NMOS) transistor pairs, each transistor having a gate (G), a drain (D), a source (S), and a bulk node (B). In the first pair, the gates of the first PMOS 2913 and first NMOS 2923 are connected to the input node (in). The source and bulk of the first PMOS 2913 are coupled to vdd, while the source and bulk of the first NMOS 2923 are coupled to vss. Also, the drain of the first PMOS 2913 is coupled to the pull-up node, while the drain of the first NMOS 2923 is coupled to the pull-down node.

In the second pair, the source of the second PMOS 2933 is coupled to the pull-up node and the source of the second NMOS 2943 is coupled to the pull-down node. The gates of the second PMOS 2933 and second NMOS 2943 are connected to the output node. The drains of the second PMOS 2933 and second NMOS 2943 are coupled to the cap node. Also, the bulk of the second PMOS 2933 is coupled to vdd, while the bulk of the second NMOS 2943 is coupled to vss.

In the third pair, the drains of the third PMOS 2953 and the third NMOS 2963 are coupled to the output node. The source and bulk of the third PMOS 2953 are coupled to vdd, while the source and bulk of the third NMOS 2963 are coupled to vss. The gates of the third PMOS 2953 and third NMOS 2963 are coupled to the cap node. Furthermore, a capacitive load 2973 can be coupled to the cap node and vss.

Figure 29D:
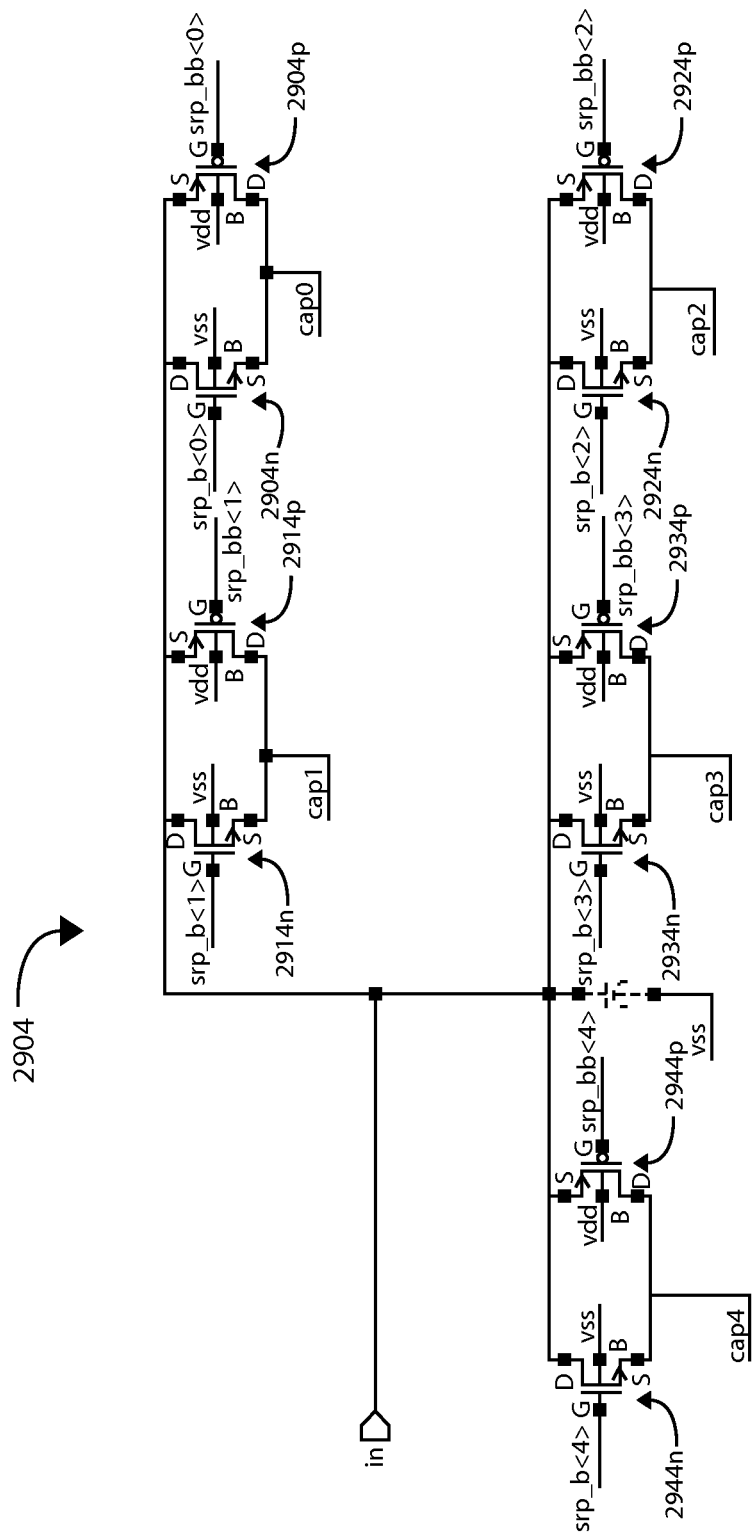

FIG. 29D is a simplified circuit diagram illustrating the cap array module of FIG. 29A according to a specific embodiment. As shown, this module 2904 also shows a similar configuration to the cap array module of FIG. 9D for the QRST driver. The cap array module 2904 includes five pairs of MOSFETS. Each pair includes a PMOS transistor and an NMOS transistor, each transistor having a gate (G), a drain (D), a source (S), and a bulk node (B). In FIG. 29D, the PMOS transistors are denoted as 2904p, 2914p, 2924p, 2934p, and 2944p.

Similarly, the NMOS transistors are denoted as 2904n, 2914n, 2924m, 2934n, and 2944n, wherein the transistors with the same numbers are configured in pairs. In each pair, the source of the PMOS and the drain of the NMOS are coupled to the input node. For each pair, the source of the NMOS and the drain of the PMOS are coupled to different cap array node (first through fifth cap array node). The bulk of each PMOS is coupled to vdd, while the bulk of each NMOS is coupled to vss. The gates of each PMOS and NMOS are coupled to different elements of the array node.

In an embodiment, the present invention includes a driver integrated circuit device. The driver device can include a front-end module, a pre-driver module, and a driver module coupled to a transmission line path. The pre-driver module can be coupled to the front-end module and can include one or more delay adjust capacitor modules, and one or more pull-down control modules. The driver module can be coupled to the pre-driver module, the driver module including one or more pull-down control logic modules.

In a specific embodiment, each of the delay adjust capacitor modules includes a skew mos module, a skew resistor module, and a cap array module. The skew mos module includes a first transistor pair, a second transistor pair, and a third transistor pair configured to a mos input node, a mos output node, a cap node, a pull-up connection node, and a pull-down connection node. The skew resistor module includes a plurality of resistors coupled in a series connection and having a plurality of resistor connection nodes at each junction between the resistors and the ends of the series connection. The nodes at each junction include a pull-up connection node, and a pull-down connection node. The cap array module includes an array of transistor pairs configured to an array of cap connection nodes; wherein the cap array module includes a cap array input node coupled to a cap connection node.

In a specific embodiment, the one or more pull-down control modules includes one or more pull-down fine control modules and one or more pull-down coarse control modules. The transmission line path is a multi-load transmission line path terminated to a vdd voltage source. Furthermore, the driver module is configured as an open-drain driver device.

Figure 30:
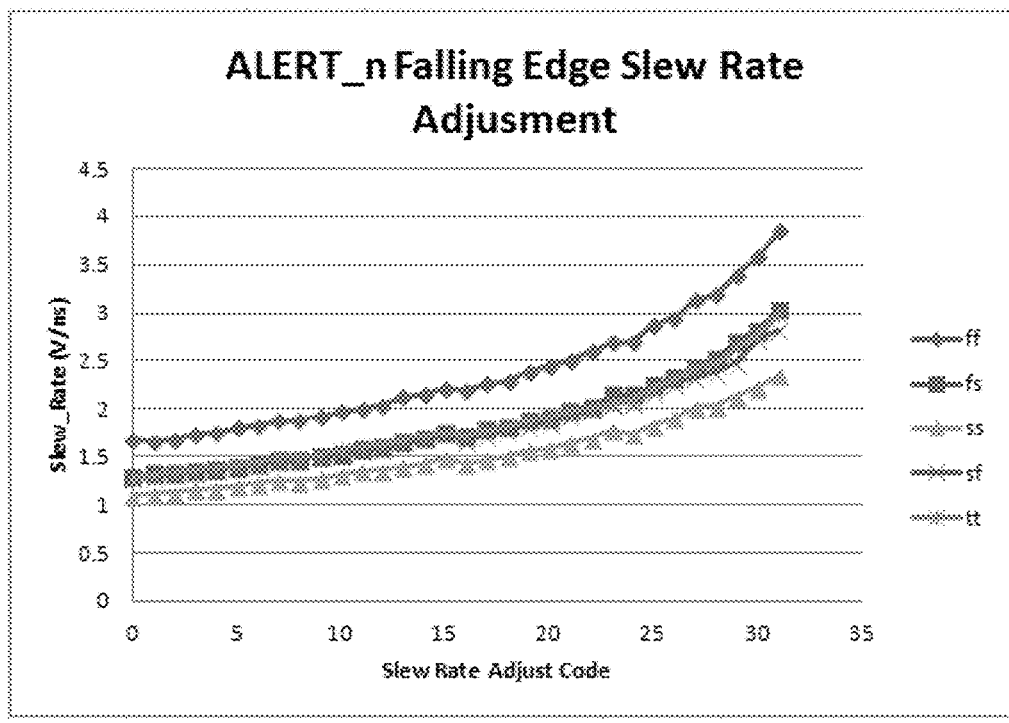
FIG. 30 is a simplified graph representing a slew rate adjustment according to an embodiment of the present invention.

FIG. 30 is a simplified graph representing a slew rate adjustment range for an ALERTn driver according to an embodiment of the present invention. These results can be from test simulations using the configuration shown in FIG. 11.

Many benefits are recognized through various embodiments of the present invention. Such benefits include several methods and circuit devices that allow the control and programmability of a driver slew rate. With control over the slew rate, the slew rate can be optimized to a value that maximizes the signal integrity eye opening. The slew rate control can be implemented in several driver embodiments, each addressing a specific structure of transmission line path and characteristic impedance termination. As described previously, these embodiments include, but are not limited to, the following: QRST driver, BCOM driver, and ALERTn driver. Furthermore, these embodiments can be implemented within a registering clock driver (RCD) IC device, a register control interface device, a register buffer device, or the like. Other benefits will be recognized by those of ordinary skill in the art that the mechanisms described can be applied to other IC systems as well.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A driver integrated circuit device, the device comprising:
   a front-end module;
   a pre-driver module coupled to the front-end module, the pre-driver module including one or more delay adjust capacitor modules, one or more pull-up control modules, and one or more pull-down control modules;
   wherein each of the delay adjust capacitor modules includes a skew mos module, a skew resistor module, and a cap array module;
   wherein the skew mos module includes a first transistor pair, a second transistor pair, and a third transistor pair configured to a mos input node, a mos output node, a cap node, a pull-up connection node, and a pull-down connection node;
   wherein the skew resistor module includes a plurality of resistors coupled in a series connection and having a plurality of resistor connection nodes at each junction between the resistors and the ends of the series connection;
   wherein the plurality of resistor connection nodes includes a cap node, a pull-up connection node, and a pull-down connection node;
   a driver module coupled to the pre-driver module, the driver module including one or more pull-up control logic modules and one or more pull-down control logic modules; and
   a transmission line path coupled to the driver module.

2. The device of claim 1 wherein the skew resistor module includes a plurality of binary weight resistors coupled in a series connection and having a plurality of resistor connection nodes at each junction between the resistors and the ends of the series connection; wherein the plurality of resistor connection nodes include resistor pull-up connection nodes and resistor pull-down connection nodes.

3. The device of claim 2 wherein the cap array module includes an array of pull-up transistors in a chain configuration and an array of pull-down transistors in a chain configuration; wherein the array of pull-up transistors are configured to the plurality of resistor pull-up connection nodes and the array of pull-down transistors are configured to the plurality of resistor pull-down connection nodes.

4. The device of claim 1 wherein the cap array module includes an array of transistor pairs configured to an array of cap connection nodes; wherein the cap array module includes a cap array input node coupled to a cap connection node.

5. The device of claim 1 wherein the one or more pull-up control modules includes one or more pull-up fine control modules and one or more pull-up coarse control modules; and wherein the one or more pull-down control modules includes one or more pull-down fine control modules and one or more pull-down coarse control modules.

6. The device of claim 1 wherein the transmission line path is a multi-load transmission line path.

7. The device of claim 6 wherein the transmission line has a first portion and a second portion, wherein the first portion is configured to one or more database loads and the second portion is configured to one or more database loads.

8. The device of claim 6 wherein the transmission line path is configured as an unterminated transmission line path.

9. The device of claim 6 wherein the transmission line path is configured as a terminated transmission line path.

10. A driver integrated circuit device, the device comprising:
 a front-end module;
 a pre-driver module coupled to the front-end module, the pre-driver module including one or more delay adjust capacitor modules, and one or more pull-down control modules;
 wherein each of the delay adjust capacitor modules includes a skew mos module, a skew resistor module, and a cap array module;
 wherein the skew mos module includes a first transistor pair, a second transistor pair, and a third transistor pair configured to a mos input node, a mos output node, a cap node, a pull-up connection node, and a pull-down connection node;
 wherein the skew resistor module includes a plurality of resistors coupled in a series connection and having a plurality of resistor connection nodes at each junction between the resistors and the ends of the series connection;
 wherein the plurality of resistor connection nodes includes a pull-up connection node, and a pull-down connection node;
 a driver module coupled to the pre-driver module, the driver module including one or more pull-down control logic modules; and
 a transmission line path coupled to the driver module.

11. The device of claim 10 wherein the cap array module includes an array of transistor pairs configured to an array of cap connection nodes; wherein the cap array module includes a cap array input node coupled to a cap connection node.

12. The device of claim 10 wherein the one or more pull-down control modules includes one or more pull-down fine control modules and one or more pull-down coarse control modules.

13. The device of claim 10 wherein the transmission line path is a multi-load transmission line path terminated to a vdd voltage source.

14. The device of claim 10 wherein the driver module is configured as an open-drain driver device.

* * * * *